(12) United States Patent
Matsuhashi

(10) Patent No.: US 12,535,728 B2
(45) Date of Patent: Jan. 27, 2026

(54) PHOTOMASK BLANK, MANUFACTURING METHOD OF PHOTOMASK AND PHOTOMASK

(71) Applicant: Shin-Etsu Chemical Co., Ltd., Tokyo (JP)

(72) Inventor: Naoki Matsuhashi, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 376 days.

(21) Appl. No.: 17/980,530

(22) Filed: Nov. 3, 2022

(65) Prior Publication Data

US 2023/0148427 A1    May 11, 2023

(30) Foreign Application Priority Data

Nov. 11, 2021  (JP) ................. 2021-184350

(51) Int. Cl.
  *G03F 1/60*  (2012.01)
  *G03F 1/50*  (2012.01)
  *G03F 1/52*  (2012.01)
  *G03F 1/58*  (2012.01)

(52) U.S. Cl.
  CPC .......... *G03F 1/60* (2013.01); *G03F 1/50* (2013.01); *G03F 1/52* (2013.01); *G03F 1/58* (2013.01)

(58) Field of Classification Search
  None
  See application file for complete search history.

(56) References Cited

U.S. PATENT DOCUMENTS

| | | | | |
|---|---|---|---|---|
| 11,402,744 B2* | 8/2022 | Matsuhashi | ............... | G03F 1/54 |
| 11,971,653 B2* | 4/2024 | Matsuhashi | ............... | G03F 1/24 |
| 2001/0044054 A1* | 11/2001 | Kaneko | ................... | G03F 1/50 |
| | | | | 428/432 |
| 2005/0208389 A1 | 9/2005 | Ishibashi et al. | | |
| 2007/0134562 A1 | 6/2007 | Hosono et al. | | |

(Continued)

FOREIGN PATENT DOCUMENTS

| | | |
|---|---|---|
| EP | 3798727 A2 | 3/2021 |
| JP | S6230624 B2 | 7/1987 |

(Continued)

OTHER PUBLICATIONS

Notice of Allowance issued on Jul. 30, 2024 for Japanese Patent Application No. 2021-184350 and its English translation provided by Applicant's Foreign Counsel.

(Continued)

*Primary Examiner* — Martin J Angebranndt
(74) *Attorney, Agent, or Firm* — Ladas & Perry, LLP

(57) ABSTRACT

A photomask blank having a substrate; and a multilayer film including a first layer, a second layer, and a third layer. The first layer contains 43 at % or less chromium, 32 at % or more oxygen, 25 at % or less nitrogen and 5 at % or more and 18 at % or less carbon and has a thickness of 8 nm or more and 16 nm or less. The second layer contains 66 at % or more and 92 at % or less chromium and 8 at % or more and 30 at % or less nitrogen and has a thickness of 50 nm or more and 75 nm or less. The third layer contains 44 at % or less chromium, 30 at % or more oxygen and 28 at % or less nitrogen and has a thickness of 10 nm or less. A surface roughness Rq of the multilayer film is 0.65 nm or less.

8 Claims, 9 Drawing Sheets

(56) References Cited

U.S. PATENT DOCUMENTS

| | | | |
|---|---|---|---|
| 2010/0084375 A1 | 4/2010 | Hosoya | |
| 2010/0136464 A1 | 6/2010 | Hosoya | |
| 2011/0081605 A1 | 4/2011 | Iwashita et al. | |
| 2011/0104592 A1 | 5/2011 | Iwashita et al. | |
| 2017/0023854 A1 | 1/2017 | Nam et al. | |
| 2017/0068156 A1* | 3/2017 | Sasamoto | G03F 1/80 |
| 2020/0379337 A1* | 12/2020 | Shin | G03F 1/32 |
| 2022/0317554 A1* | 10/2022 | Matsuhashi | G03F 1/58 |

FOREIGN PATENT DOCUMENTS

| | | | | |
|---|---|---|---|---|
| JP | 2004053663 A | * | 2/2004 | |
| JP | 2007078802 A | | 3/2007 | |
| JP | 2007163867 A | | 6/2007 | |
| JP | 2010092947 A | | 4/2010 | |
| JP | 2010109336 A | | 5/2010 | |
| JP | 2012032783 A | * | 2/2012 | G03F 1/46 |
| JP | 2013231998 A | | 11/2013 | |
| JP | 2013238629 A | * | 11/2013 | |
| JP | 2017027006 A | | 2/2017 | |
| JP | 2020016845 A | | 1/2020 | |
| WO | 2003085709 A1 | | 10/2003 | |
| WO | 2009123166 A1 | | 10/2009 | |
| WO | WO-2009123167 A1 | * | 10/2009 | G03F 1/32 |

OTHER PUBLICATIONS

Extended European Search Report for corresponding European Patent application No. 22206302.6 issued on Apr. 11, 2023, all pages.

* cited by examiner

PHOTOMASK BLANK, MANUFACTURING METHOD OF PHOTOMASK AND PHOTOMASK

TECHNICAL FIELD

The present invention relates to a photomask blank (particularly a photomask blank used in the manufacture of semiconductor devices and the management of manufacturing apparatuses), a manufacturing method of a photomask using the same, and a photomask.

The present application claims the priority of Japanese Patent Application No. 2021-184350 filed on Nov. 11, 2021, the contents of which are entirely incorporated by reference.

BACKGROUND ART

In recent years, with miniaturization of semiconductor devices, particularly with high integration of large-scale integrated circuits, high pattern resolution is required for projection exposure. Therefore, for the photomask, a phase shift mask has been developed as a method for improving resolution of a transfer pattern. The principle of the phase shift method is that the phase of transmitted light having passed through the opening of the photomask is adjusted to be inverted by about 180 degrees with respect to the phase of transmitted light having passed through a portion adjacent to the opening, thereby weakening the light intensity at a boundary part when the transmitted light rays interfere with each other, and as a result, the resolution and the focal depth of the transfer pattern are improved, and photomasks utilizing this principle are generally referred to as phase shift masks.

The phase shift mask blank used for the phase shift mask most commonly has a structure in which a phase shift film is laminated on a transparent substrate such as a glass substrate and in which a film containing chromium (Cr) is laminated on the phase shift film. The phase shift film usually has a phase difference of 175 to 185 degrees and a transmittance of about 6 to 30% with respect to exposure light and is mainly formed of a film containing molybdenum (Mo) and silicon (Si). In addition, the film thickness of the chromium-containing film is adjusted so as to exhibit a desired optical density together with the phase shift film, and the chromium-containing film is generally used as a light shielding film and a hard mask film for etching the phase shift film.

As a method for forming the pattern of the phase shift mask from the phase shift mask blank, more specifically, a resist film is formed on a chromium-containing film of the phase shift mask blank, a pattern is drawn on the resist film with light or an electron beam, development is performed to form a resist pattern, and the chromium-containing film is etched using the resist pattern as an etching mask to form a pattern. Further, the phase shift film is etched using the pattern of the chromium-containing film as an etching mask to form a phase shift film pattern, and then the resist pattern and the pattern of the chromium-containing film are removed.

Here, the light shielding film is left outside the portion where the circuit pattern of the phase shift film pattern is formed, and a light shielding part (light shielding film pattern) of an outer circumferential part of the phase shift mask is formed such that the combined optical density of the phase shift film and the light shielding film is 3 or more. This is to prevent unnecessary exposure light from leaking and being applied to the resist film on an adjacent chip located outside the circuit pattern when the circuit pattern is transferred to the wafer using the wafer exposure apparatus. As a method for forming such a light shielding film pattern, a method is generally used in which a phase shift film pattern is formed, a resist pattern is removed, a resist film is newly formed, a chromium-containing film is etched using the resist pattern formed by pattern drawing and development as an etching mask, and a light shielding film pattern at an outer circumferential part is formed.

In a phase shift mask requiring high-precision patterning, dry etching using gas plasma is mainly used for etching. Dry etching using a chlorine-based gas including oxygen (chlorine-based dry etching) is used for dry etching of the chromium-containing film, and dry etching using a fluorine-based gas (fluorine-based dry etching) is used for dry etching of a film containing molybdenum and silicon. In particular, in dry etching of the chromium-containing film, it is known that chemical reactivity is enhanced and an etching rate is improved by using an etching gas obtained by mixing 10 to 25 vol % of oxygen gas with chlorine-based gas.

Along with miniaturization of a circuit pattern, a technique for finely forming a phase shift mask pattern is also required. In particular, an assist pattern of a line pattern that promotes the resolution of a main pattern of the phase shift mask needs to be formed smaller than the main pattern so as not to be transferred to the wafer when the circuit pattern is transferred to the wafer using a wafer exposure apparatus. For a phase shift mask of the generation in which the pitch of the line and space pattern of the circuit on the wafer is 10 nm, the line width of the assist pattern of the line pattern on the phase shift mask is required to be about 40 nm.

Further, along with miniaturization of semiconductor devices, particularly due to high integration of large-scale integrated circuits, high pattern resolution is required for projection exposure, and desired pattern resolution has become difficult to obtain even with the phase shift mask. Therefore, EUV lithography using light in the extreme ultraviolet region for exposure light has been used.

The light in the extreme ultraviolet region is easily absorbed by any substance, and transmission lithography such as conventional photolithography using ArF light cannot be used. Therefore, in the EUV lithography, a catoptric system is used.

A photomask used in EUV lithography has a structure in which a reflective layer that reflects the light in the extreme ultraviolet region and an absorbing layer that absorbs the light in the extreme ultraviolet region are formed in this order on a substrate made of glass or the like. As the reflective layer, a multilayer reflective film is used in which the reflectance when the layer surface is irradiated with light in the extreme ultraviolet region is increased by alternately laminating a low refractive index film and a high refractive index film. A molybdenum (Mo) layer is usually used as the low refractive index film of the multilayer reflective film, and a silicon (Si) layer is usually used as the high refractive index film.

For an absorber layer, a material having a high absorption coefficient for EUV light, specifically, for example, a material containing chromium (Cr) or tantalum (Ta) as a main component is used.

In addition, light in the extreme ultraviolet region used in EUV lithography has a wavelength of 13.5 nm while conventional ArF light has a wavelength of 193 nm, and the exposure wavelength is shorter than that of conventional photolithography, so that a finer pattern on a photomask can be transferred.

On the other hand, in the EUV lithography, minute foreign matter on a photomask that is not transferred in ArF lithography is also transferred, which prevents production of a desired pattern. Therefore, in EUV lithography, it is required to give a guarantee against finer defects as compared with conventional photolithography. For this purpose, it is necessary not to generate foreign matter in a photomask manufacturing process, and a photomask blank in which a finer defect can be detected than in apparatus management in conventional photolithography is required.

In apparatus management of a photomask manufacturing apparatus, for example, in a dry etcher, a photomask to be treated is placed in a loader, then conveyed to a conveyance chamber, and then conveyed to a plasma treatment chamber. In a case where dust is generated from a side wall in the plasma treatment chamber or from a stage and where foreign matter adheres to the circuit pattern of the photomask, the foreign matter serves as a mask that prevents etching and prevents production of a desired photomask pattern.

Therefore, in order to confirm that no dust is generated in the conveyance chamber and the plasma treatment chamber, the photomask blank or a transparent substrate is conveyed to the conveyance chamber, then transferred to the plasma treatment chamber, not subjected to the plasma treatment, again conveyed to the conveyance chamber, and then returned to the loader, and then the increase and increase position of the foreign matter on the photomask blank or the surface layer of the transparent substrate are examined with a photomask blank inspection apparatus.

In addition to the dry etcher described above, when a photomask is manufactured, it is necessary to manage foreign matter in the apparatus in a resist coating apparatus, an electron beam drawing apparatus, a developing apparatus, a cleaning apparatus, a pattern appearance inspection apparatus for a photomask, and a correction apparatus. Furthermore, also in an exposure apparatus used in a wafer exposure step, it is necessary to manage foreign matter in the apparatus. In particular, in EUV lithography, a pellicle for photomask protection that prevents foreign matter from adhering to the circuit pattern of the photomask has not been put into practical use, and apparatus management in a wafer exposure apparatus is required.

For defect inspection of a photomask blank, a photomask blank inspection apparatus using light in the ultraviolet region is used. A defect inspection apparatus for a photomask blank includes light emitting means that emits light in a specific wavelength range and a detector that receives light reflected by a surface of the photomask blank irradiated with the light emitted from the light emitting means.

In the defect inspection apparatus for a photomask blank, when the surface reflectance of the photomask blank to be inspected is low, the photomask can be irradiated with a larger amount of light, and inspection with higher sensitivity can be performed. This is because, in the case where the reflectance of the photomask blank is high, when the light from the light emitting means collides with foreign matter and the film around the foreign matter, and then the reflected light is detected by the detector, the contrast between the reflected light from the foreign matter and the reflected light from the film around the foreign matter becomes small, so that it becomes difficult to determine the difference between the reflected light from the foreign matter and the reflected light from the film, and the photomask cannot be irradiated with a large amount of light from the light emitting means. It is possible to detect a smaller defect by irradiating the photomask with a larger amount of light from the light emitting means.

In logic devices of the 7-nm and 5-nm generations, it is required that there is no defect of 50 nm on the photomask blank, and it is also required that there is no defect of 50 nm inside the photomask manufacturing apparatus. Therefore, the photomask blank for checking the state of the photomask manufacturing apparatus is required to have a defect of 50 nm to be detected. The inspection wavelength of the photomask blank defect inspection apparatus of logic devices of the 7-nm, 5-nm, and 3-nm generations is in the ultraviolet region of about 193 nm to 400 nm.

In order to manage a photomask, an exposure apparatus used in a wafer exposure step generally forms a barcode pattern at a mask end of the photomask by lithography to perform management. The barcode pattern is read by a device including light emitting means of a wavelength of 400 nm or more and a detector that receives the reflected light.

Since a wafer exposure machine used in EUV lithography uses a catoptric system, means for reading a barcode pattern is also a catoptric system. In the case of an optical system that receives reflected light, a reflectance of 27% at a wavelength of 400 nm or more is required.

For example, in the method disclosed in JP S62-30624 A, a chromium oxide layer having a relatively low oxygen content is formed on a transparent substrate in contact with the transparent substrate, a thick chromium oxide film having a low oxygen content is formed in contact with the chromium oxide layer, and a thin oxygen-rich chromium oxide film having a high oxygen content is formed in contact with the chromium oxide film to reduce the surface reflectance of a multilayer film made of materials containing chromium.

Accordingly, inspection with high sensitivity can be performed.

SUMMARY OF INVENTION

Problem to be Solved by Invention

As a factor that hinders the defect inspection of the photomask blank by the inspection apparatus, there is also a problem caused by the chromium film. When the roughness of the film surface of the chromium film is poor, irregularities on the film surface layer of the chromium film are determined as defects, and a large amount of pseudo defects are detected. In that case, it is difficult to distinguish a defect to be removed from the irregularities of the chromium film, and it is necessary to lower the inspection sensitivity, and the inspection capability becomes insufficient.

For example, in the method disclosed in JP S62-30624 A described above, the chromium oxide layer having a relatively low oxygen content is formed in contact with the transparent substrate, the thick chromium oxide film having a low oxygen content is formed in contact with the chromium oxide layer, and the thin oxygen-rich chromium oxide film having a high oxygen content is formed in contact with the chromium oxide film. However, it has been found that defects of 50 nm cannot be stably detected because the surface roughness Rq of the multilayer film made of materials containing chromium is poor, and the inspection sensitivity of a defect inspection apparatus for a photomask blank at wavelengths of 193 nm, 248 nm, and 355 nm cannot be sufficiently increased.

Here, the surface roughness Rq of the film represents a root mean square at a reference length (measurement range is a square region of 1×1 μm) and means a standard deviation of the surface roughness.

In addition, since the resistance value of the multilayer film made of the materials containing chromium is high, charges are likely to be accumulated on the film surface layer, foreign matter having negative charges generated in the photomask manufacturing apparatus is kept away from the film made of the materials containing chromium by Coulomb repulsion, the foreign matter is not adsorbed on the surface layer of the multilayer film made of the materials containing chromium, and when the multilayer film is used in apparatus management of the photomask manufacturing apparatus, a true apparatus state cannot be investigated.

Furthermore, in an exposure apparatus used in a wafer exposure step, when a barcode pattern of a photomask is read with a catoptric system, a reflectance of 27% at a wavelength of 400 nm or more is required, but the reflectance cannot be satisfied by the method disclosed in JP S62-30624 A described above.

The present invention has been made in order to solve the above problems, and an object of the present invention is to provide a photomask blank that offers a good surface roughness Rq of a multilayer film made of materials containing chromium, enables inspection sensitivity of a defect inspection apparatus for the photomask blank to be sufficiently increased, enables a defect of 50 nm to be detected, can adsorb ambient foreign matter in a photomask manufacturing apparatus due to a small resistance value of the film and is therefore useful for manufacturing apparatus management, enables a barcode pattern of the photomask to be read with a catoptric system in an exposure apparatus used in a wafer exposure step, and enables a pattern of the photomask to be manufactured using a known photomask process.

Another object is to provide a manufacturing method of a photomask and a photomask using the photomask blank.

Means for Solving Problem

The present invention was made to reach the above object and provide a photomask blank comprising:
a substrate; and
a multilayer film including a first layer, a second layer, and a third layer from a side spaced apart from the substrate,
wherein the first layer contains chromium, oxygen, nitrogen and carbon such that a chromium content is 43 at % or less, an oxygen content is 32 at % or more, a nitrogen content is 25 at % or less, and a carbon content is 5 at % or more and 18 at % or less, and the first layer has a thickness of 8 nm or more and 16 nm or less,
wherein the second layer contains chromium and nitrogen such that a chromium content is 66 at % or more and 92 at % or less and a nitrogen content is 8 at % or more and 30 at % or less, and the second layer has a thickness of 50 nm or more and 75 nm or less, and
wherein the third layer contains chromium, oxygen and nitrogen such that a chromium content is 44 at % or less, an oxygen content is 30 at % or more, and a nitrogen content is 28 at, or less, and the third layer has a thickness of 10 nm or less, and
wherein a surface roughness Rq of the multilayer film is 0.65 nm or less.

Regarding the multilayer film (hereinafter also referred to as a chromium-containing film), first, contents of oxygen, nitrogen, and carbon in a first layer within the above ranges are beneficial for improvement of the surface roughness (particularly, the surface roughness Rq) of the chromium-containing film. In addition, such contents are beneficial for adjustment of the reflectance of the chromium-containing film (in particular, it is a target to set the reflectance for exposure light having a wavelength of 193 nm to 22% or less, the reflectance for exposure light having a wavelength of 248 nm to 18% or less, the reflectance for exposure light having a wavelength of 355 nm to 32% or less, the reflectance for exposure light having a wavelength of 400 nm to 27% or more, and the surface roughness Rq of the multilayer film to 0.65 nm or less. Hereinafter the exposure light is also simply referred to as light).

When the thickness of the first layer is in the above range, the first layer can be appropriately easily affected (influence on the surface roughness, reflectance, and conductivity) by a second layer.

A content of nitrogen in the second layer within the above range is beneficial for improvement of the surface roughness of the chromium-containing film and for adjustment of the reflectance. In addition, the content of chromium is higher than that in the first layer and a third layer, and the conductivity of the second layer can be increased.

In addition, a thickness of the second layer within the above range is beneficial for making the reflectance for light having a wavelength of 400 nm in the chromium-containing film 27% or more.

Contents of oxygen and nitrogen in the third layer within the above ranges are beneficial for adjustment of the reflectance.

Further, a thickness of the third layer within the above range is beneficial for adjustment of the reflectance.

For example, when the chromium-containing film is only the first layer, it is not possible to achieve good surface roughness and the adjustment of the target reflectance as described above. However, since the thickness of the first layer is in the above range, the first layer can also be affected by the second layer (and the third layer) as described above, and good adjustment of the surface roughness and the reflectance can be achieved.

Since the surface roughness is good, it is possible to prevent the unevenness of the surface layer of the chromium-containing film from being determined to be a defect and a large amount of such pseudo defects from being detected in defect inspection of the photomask blank. Therefore, it is not necessary to lower the inspection sensitivity for light having a wavelength of 193 nm, a wavelength of 248 nm, and a wavelength of 355 nm in order to distinguish the defect to be removed from the pseudo defect, and thus it is possible to detect a defect having a size of 50 nm level in particular.

In addition, regarding the adjustment of the reflectance, the reflectance for light having a wavelength of 193 nm can be adjusted to 22% or less, the reflectance for light having a wavelength of 248 nm can be adjusted to 18% or less, and the reflectance for light having a wavelength of 355 nm can be adjusted to 32% or less. Therefore, in defect inspection, irradiation with a larger amount of light is possible, inspection with higher sensitivity can be performed, and a defect having a smaller size can be detected.

In addition, since the reflectance for light having a wavelength of 400 nm can be adjusted to 27% or more, a barcode pattern produced for management at the mask end when the photomask is formed can be read with a catoptric system.

Furthermore, as described above, a three-layer structure is provided in which the first layer and the third layer are located so as to sandwich the second layer having high conductivity, and the resistance value of the chromium-containing film can be reduced.

Since the film resistance value can be reduced, ambient foreign matter inside the photomask manufacturing apparatus can be adsorbed, and the film can be useful for management of the manufacturing apparatus.

In addition, a pattern of a photomask can be sufficiently manufactured from such a photomask blank having a chromium-containing film by a known photomask process.

At this time, the multilayer film can be a light shielding film and have a reflectance of 22%. or less for exposure light having a wavelength of 193 nm, a reflectance of 18% or less for exposure light having a wavelength of 248 nm, a reflectance of 32% or less for exposure light having a wavelength of 355 nm, and a reflectance of 27% or more for exposure light having a wavelength of 400 nm.

With such a configuration, a photomask blank to be provided has a light shielding film that can be irradiated with a larger amount of light having a wavelength of 193 nm, a wavelength of 248 nm, and a wavelength of 355 nm used for the inspection in the defect inspection and enables the inspection with higher sensitivity as well as detection of a defect having a smaller size. Further, the management barcode pattern of the photomask can be read.

In addition, the film thickness of the multilayer film can be 53 nm or more and 100 nm or less.

With such a configuration, the reflectance can be more reliably adjusted.

In addition, the resistance value of the multilayer film can be 20Ω/□ or less.

With such a configuration, since the resistance value is small, it is possible to more reliably adsorb the ambient foreign matter in the photomask manufacturing apparatus, and it is more useful for managing the manufacturing apparatus.

In addition, the multilayer film may be provided on the front surface side and the back surface side of the substrate.

In the present embodiment, the multilayer film on the back surface side is also referred to as a back side film.

The back side film can have the first layer, the second layer, and the third layer similar to those of the multilayer film from a side spaced apart from the substrate.

When the substrate is made of, for example, quartz, charges are easily accumulated on a surface layer of the substrate, and foreign matter generated in the photomask manufacturing apparatus is hardly adsorbed. However, in addition to the multilayer film on the front surface side as described above, if the back surface side film is provided on the opposite side (back surface side), foreign matter can be easily adsorbed even on the side having the back side film, and it can be made more useful for management of the manufacturing apparatus.

The present invention also provides a manufacturing method of a photomask having a circuit pattern of the multilayer film from the photomask blank, the method including:

(A) a step of forming a resist film on a side of the multilayer film spaced apart from the substrate;
(B) a step of patterning the resist film to form a resist pattern;
(C) a step of patterning the multilayer film by dry etching using a chlorine-based gas including oxygen using the resist pattern as an etching mask to form a pattern of the multilayer film; and
(D) a step of removing the resist pattern.

In this way, it is possible to manufacture a photomask that has good surface roughness and enables detection of a defect having a size of 50 nm in defect inspection, adsorption of foreign matter in a manufacturing apparatus, and reading of a barcode pattern.

The present invention provides a photomask comprising:
a substrate; and
a multilayer film provided on the substrate and having an effective region being a circuit pattern,
wherein the multilayer film includes a first layer, a second layer, and a third layer from a side spaced apart from the substrate,
wherein the first layer contains chromium, oxygen, nitrogen and carbon such that the chromium content is 43 at % or less, the oxygen content is 32 at % or more, the nitrogen content is 25 at % or less, and the carbon content is 5 at % or more and 18 at % or less, and the first layer has a thickness of 8 nm or more and 16 nm or less,
wherein the second layer contains chromium and nitrogen such that the chromium content is 66 at % or more and 92 at % or less and the nitrogen content is 8 at % or more and 30 at % or less, and the second layer has a thickness of 50 nm or more and 75 nm or less, and
wherein the third layer contains chromium, oxygen and nitrogen such that the chromium content is 44 at % or less, the oxygen content is 30 at % or more, and the nitrogen content is 28 at % or less, and the third layer has a thickness of 10 nm or less, and
wherein a surface roughness Rq of the multilayer film is 0.65 nm or less.

Such a photomask has good surface roughness and enables detection of a defect having a size of 50 nm in defect inspection, adsorption of foreign matter in a manufacturing apparatus, and reading of a barcode pattern. Moreover, a photomask pattern can be manufactured from the photomask blank by a known photomask process.

Effects of the Invention

In the photomask blank of the present invention, the surface roughness Rq of the multilayer film is 0.65 nm or less, and even if the inspection sensitivity of the photomask blank inspection apparatus is increased, a defect of 50 nm can be detected at inspection wavelengths of 193 nm, 248 nm, and 355 nm without detecting a pseudo defect. In addition, in particular, the reflectance for exposure light having a wavelength of 400 nm is 27% or more, and a barcode pattern can be read. In addition, since the resistance value of the film is small, it is possible to adsorb ambient foreign matter. In particular, when the multilayer films are laminated on both sides of the substrate, foreign matter can be adsorbed on the upper surface and the lower surface of the photomask blank.

DETAILED DESCRIPTION

Figure 1:
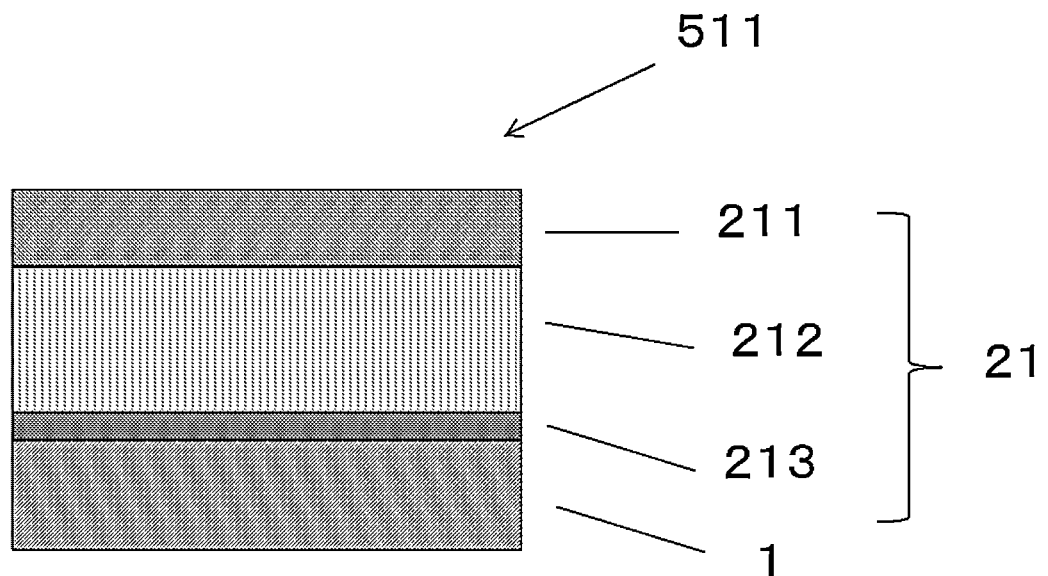
FIG. 1 is a cross-sectional view illustrating an example of a first aspect (photomask blank) of a photomask blank of the present invention.

As described above, photomask blanks have had problems caused by surface roughness, the reflectance for light having a wavelength of 193 nm, light having a wavelength of 248 nm, light having a wavelength of 355 nm, or light having a wavelength of 400 nm, and the resistance value.

Therefore, in order to solve the above problems, the present inventors have intensively studied a photomask blank including a substrate such as a transparent substrate and a film formed of a multilayer film made of a material containing chromium on the substrate. As a result, the present inventors have found that a layer containing oxygen, nitrogen, and carbon and containing a large amount of oxygen is favorable in order that the surface roughness Rq of the film is 0.65 nm or less, the surface reflectance particularly for exposure light having a wavelength of 193 nm, a wavelength of 248 nm, and a wavelength of 355 nm is low, and the reflectance for exposure light having a wavelength of 400 nm satisfies 27% or more.

Furthermore, the present inventors have found that when the resistance value of the multilayer film made of a material containing chromium is a small value such as 20Ω/□ or less, ambient foreign matter can be adsorbed, and thus the resistance value of the film can be reduced by interposing a layer having good conductivity, such as a chromium nitride layer, instead of using a single layer of a chromium-containing film to form a three-layer structure of, for example, a chromium oxynitrocarbide layer, a chromium nitride layer, and a chromium oxynitride layer from a side spaced apart from the substrate.

Further, from these findings, it has been found that a photomask blank is effective that includes: a substrate; and a multilayer film made of a material containing chromium, in which the multilayer film includes a first layer, a second layer, and a third layer from a side spaced apart from the substrate, all of the first layer, the second layer, and the third layer contain chromium, the first layer further contains oxygen, nitrogen, and carbon such that the chromium content is 43 at % or less, the oxygen content is 32 at % or more, the nitrogen content is 25 at % or less, and the carbon content is 5 at % or more and 18 at % or less and has a thickness of 8 nm or more and 16 nm or less, the second layer further contains nitrogen such that the chromium content is 66 at % or more and 92 at % or less and the nitrogen content is 8 at % or more and 30 at % or less and has a thickness of 50 nm or more and 75 nm or less, and the third layer further contains oxygen and nitrogen such that the chromium content is 44 at, or less, the oxygen content is 30 at % or more, and the nitrogen content is 28 at % or less and has a thickness of 10 nm or less, thereby completing the present invention.

Hereinafter, the present embodiment will be described.

A photomask blank of the present embodiment includes a substrate and a multilayer film made of materials containing chromium on the substrate. In the present embodiment, the multilayer film made of the materials containing chromium is a laminated film having a three-layer structure including a first layer, a second layer, and a third layer from a side spaced apart from the substrate. The multilayer film made of the materials containing chromium may include four or more layers, for example, five layers or six layers.

As will be described in detail later, the multilayer film made of the materials containing chromium may be laminated not only on one side but also on both sides of the substrate.

(Regarding Substrate)

The substrate is not particularly limited in terms of the type of substrate and the substrate size, and a reflective photomask blank and a reflective photomask do not necessarily need to be transparent at the wavelength used as the exposure wavelength. In a transmissive photomask blank and a transmissive photomask, a transparent substrate such as a quartz substrate that is transparent at a wavelength used as an exposure wavelength is applied, and for example, a substrate called a 6025 substrate having a size of 6 inches square and a thickness of 0.25 inches defined in the SEMI standards is suitable. When the SI system is used, the 6025 substrate is usually expressed as a substrate of 152 mm square and 6.35 mm thick.

Hereinafter, structures of the photomask blank and a photomask according to the present embodiment, and a method for manufacturing the photomask from the photomask blank will be described with reference to the drawings. The same components are denoted by the same reference numerals, and redundant description may be omitted. In addition, the drawings may be extended for convenience, and dimensional ratios and the like of the respective components are not necessarily the same as actual ones.

FIG. 1 is a cross-sectional view illustrating an example of a first aspect of the photomask blank of the present embodiment. This photomask blank 511 includes, on a transparent substrate 1, a multilayer film (also referred to as a chromium-containing film or a film to be processed) (for example, a light shielding film) 21 formed in contact with the transparent substrate 1 and made of materials containing chromium. The multilayer film 21 made of the materials containing chromium includes a first layer 211, a second layer 212, and a third layer 213 from the side spaced apart from the transparent substrate. In other words, the third layer 213, the second layer 212, and the first layer 211 are laminated from the transparent substrate 1 side.

Figure 2:
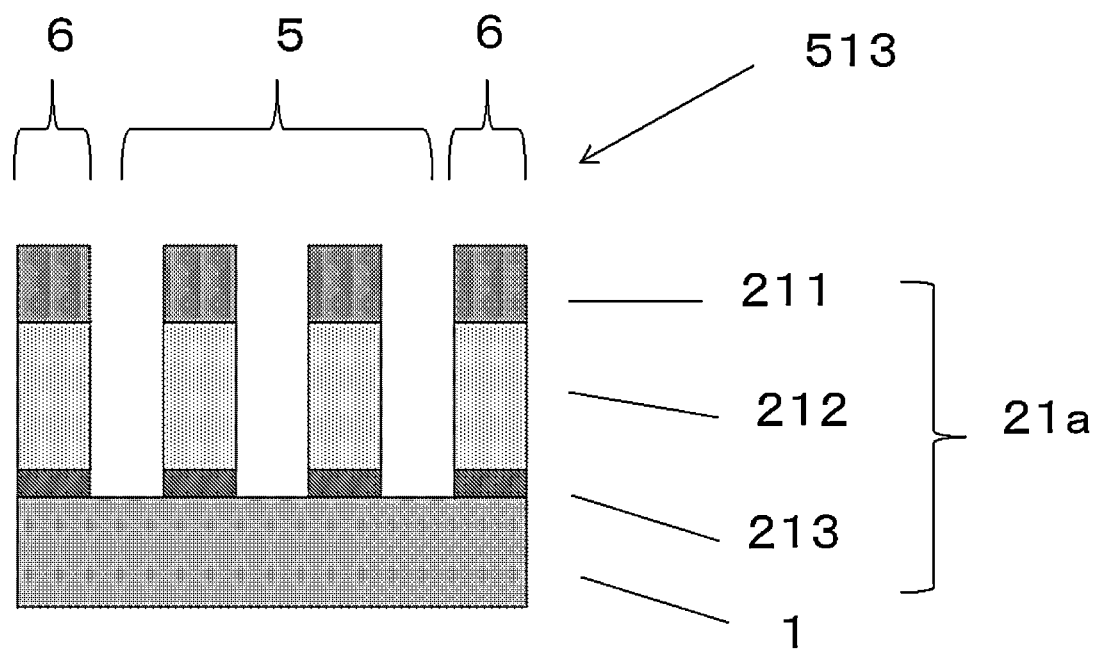
FIG. 2 is a cross-sectional view illustrating an example of a first aspect (photomask) of a photomask of the present invention.

FIG. 2 is a cross-sectional view illustrating an example of a first aspect of the photomask of the present embodiment. This photomask 513 includes, on the transparent substrate 1, a pattern (light shielding film pattern) 21a of the multilayer film formed in contact with the transparent substrate 1 and made of materials containing chromium. The light shielding film pattern 21a includes the first layer 211, the second layer 212, and the third layer 213 from the side spaced apart from the transparent substrate 1 (the third layer 213, the second layer 212, and the first layer 211 from the transparent substrate 1 side). The photomask 513 illustrated in FIG. 2 can be manufactured from the photomask blank 511 illustrated in FIG. 1.

In the photomask 513, a region where a circuit pattern is drawn is an effective region 5, and a region located around the effective region 5 and where the circuit pattern is not drawn is a light shielding film region 6.

Figure 3:
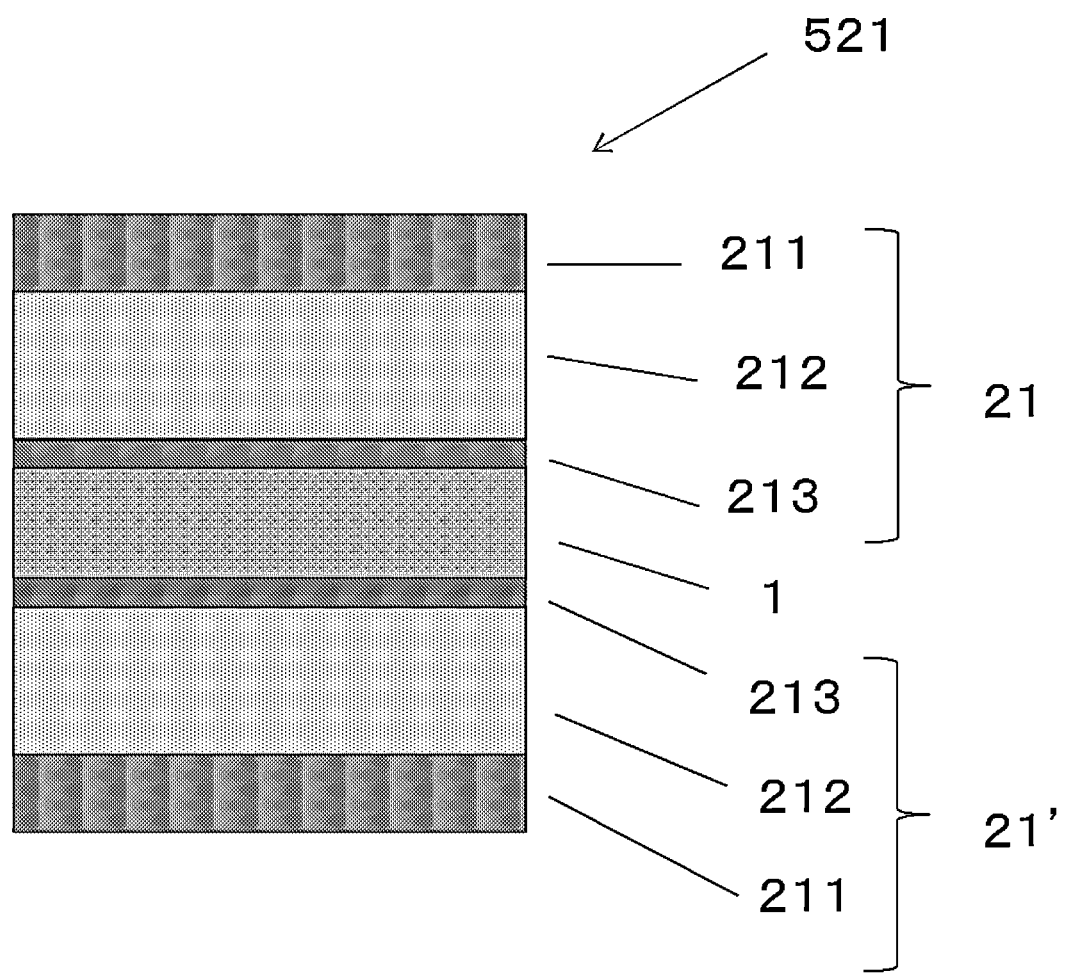
FIG. 3 is a cross-sectional view illustrating an example of a second aspect (photomask blank) of the photomask blank of the present invention.

FIG. 3 is a cross-sectional view illustrating an example of a second aspect of the photomask blank of the present embodiment. This photomask blank 521 first has the multilayer film 21 (film to be processed) made of materials containing chromium on the upper surface side of the transparent substrate 1 and includes the first layer 211, the second layer 212, and the third layer 213 from the side spaced apart from the transparent substrate. A back side film 21' is further provided on the opposite side (lower surface side). The back side film 21' has a first layer 211, a second layer 212, and a third layer 213 similar to those of the multilayer film 21 made of the materials containing chromium on the upper surface side from the side spaced apart from the transparent substrate 1. That is, in this aspect, multilayer films made of the same materials containing chromium are provided on both sides in contact with the transparent substrate 1.

Figure 4:
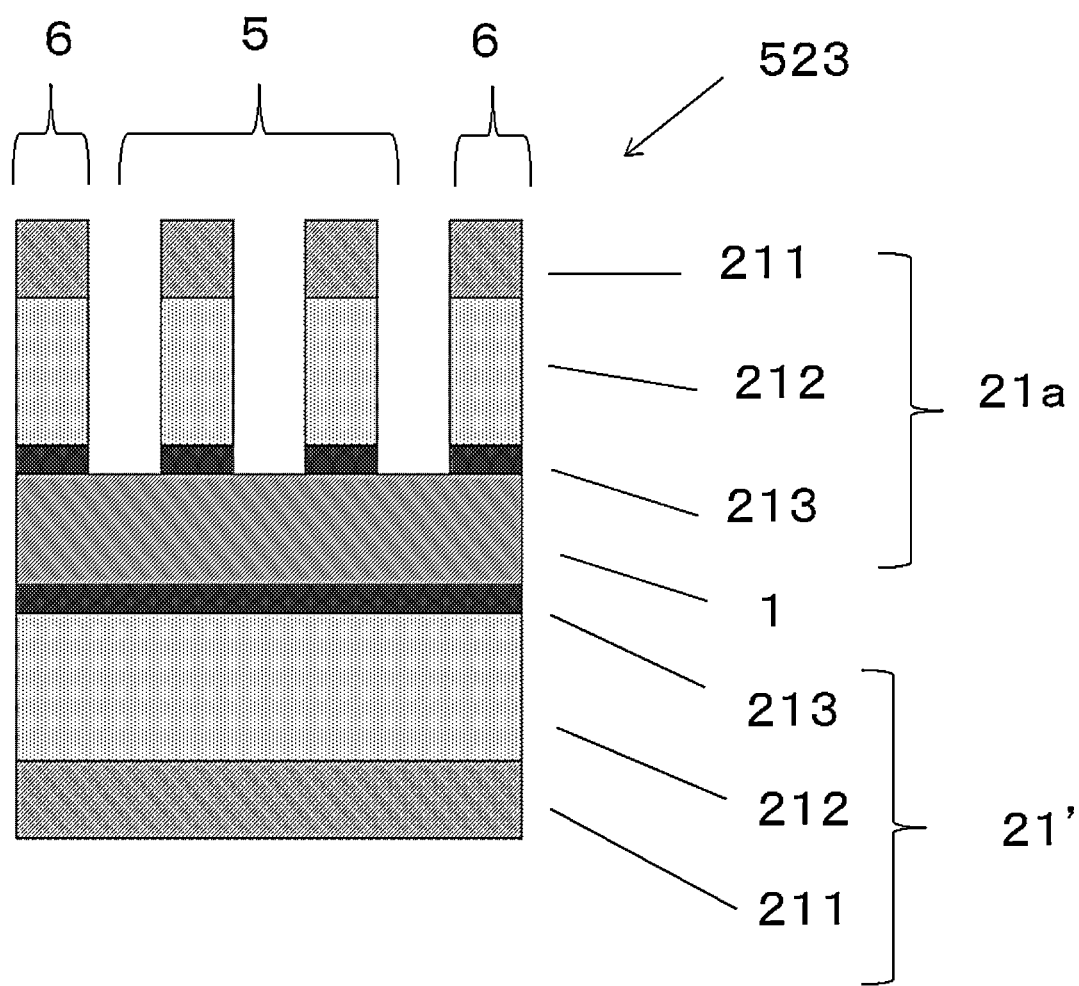
FIG. 4 is a cross-sectional view illustrating an example of a second aspect (photomask) of the photomask of the present invention.

FIG. 4 is a cross-sectional view illustrating an example of a second aspect of the photomask of the present embodiment. This photomask 523 has the pattern (light shielding film pattern) 21a of the multilayer film formed on the upper surface side of the transparent substrate 1 in contact with the transparent substrate 1 and made of the materials containing chromium and includes the first layer 211, the second layer 212, and the third layer 213 from the side spaced apart from the transparent substrate. A back side film 21' is further provided on the opposite side (lower surface side). The back side film 21' has the first layer 211, the second layer 212, and the third layer 213 similar to those of the multilayer film 21 made of the materials containing chromium on the upper surface side from the side spaced apart from the transparent substrate 1. As illustrated in FIG. 4, the back side film 21' may not be patterned.

In the present embodiment, the multilayer film made of the materials containing chromium is a laminated film having a three-layer structure including the first layer, the second layer, and the third layer from the side spaced apart from the substrate, in which the first layer is made of a material containing chromium, oxygen, nitrogen, and carbon, the second layer is made of a material containing chromium and nitrogen, and the third layer is made of a material containing chromium, oxygen, and nitrogen. The materials containing chromium are preferably materials that have resistance to fluorine-based dry etching and can be removed by chlorine-based dry etching.

It is desirable that the material containing chromium, oxygen, chlorine, and carbon for the first layer do not contain silicon. It is preferable that the material containing chromium, oxygen, and nitrogen for the third layer do not contain silicon. As the material containing chromium, oxygen, nitrogen, and carbon for the first layer, a material (CrOCN) composed of chromium (Cr), oxygen (O), nitrogen (N), and carbon (C) is suitable. As the material containing chromium, oxygen, and nitrogen for the third layer, a material (CrON) composed of chromium (Cr), oxygen (O), and nitrogen (N) is suitable.

On the other hand, it is preferable that the material containing chromium and nitrogen for the second layer also do not contain silicon. As the material containing chromium and nitrogen for the second layer, a material (CrN) composed of chromium (Cr) and nitrogen (N) is suitable.

Hereinafter, each layer will be described in more detail. Note that, basically, the content of each atom, the thickness, and the effects thereof will be described for each layer, but since there is also interaction between layers, description of another layer and a relationship with the another layer may also be described in a section describing a certain layer.
(Regarding First Layer)

In the multilayer film made of the materials containing chromium of the present embodiment, the composition of the first layer (upper layer), which is a layer on a side spaced apart from the substrate, has a chromium content of 43 at % or less, an oxygen content of 32 at % or more, a nitrogen content of 25 at % or less, a carbon content of 5 at % or more and 18 at % or less, and the thickness is 8 nm or more and 16 nm or less.

The chromium content of the first layer is preferably 43 at % or less and is preferably 30 at % or more, particularly preferably 38 at % or more.

The oxygen content of the first layer is preferably 32 at % or more and is preferably 60 at % or less, particularly preferably 54 at % or less.

The nitrogen content of the first layer is preferably 25 at % or less and is preferably 5 at % or more, particularly preferably 8 at % or more.

The carbon content of the first layer is preferably 5 at % or more and 18 at % or less and is preferably 8 at % or more, particularly preferably 10 at % or more.

The thickness of the first layer is preferably 16 nm or less and preferably 10 nm or more.

When the photomask is manufactured from the photomask blank, the first layer is a layer that is in direct contact with a cleaning liquid and is in contact with a resist film, and when inspection with a photomask blank inspection apparatus is performed, the first layer is a layer that is located on a side spaced apart from the substrate, the side being a side on which light emitted from light emitting means is incident. Therefore, the first layer is required to have high chemical resistance to the cleaning liquid, and the first layer, the second layer, and the third layer as a whole are required to have a reflectance of 22% or less for exposure light having a wavelength of 193 nm, a reflectance of 18% or less for exposure light having a wavelength of 248 nm, a reflectance of 32% or less for exposure light having a wavelength of 355 nm, and a reflectance of 27% or more for exposure light having a wavelength of 400 nm (hereinafter also referred to as reflectance adjustment).

As compared with chromium oxide (CrO), chromium oxynitride (CrON) is not dissolved in a mixed solution of sulfuric acid and hydrogen peroxide water, ammonia-added water (ammonia-added hydrogen peroxide water, APM), or the like and can stably maintain optical characteristics.

Chromium oxynitrocarbide (CrOCN) has a lower reflectance for exposure light than chromium nitride (CrN). The reflectance for exposure light having a short wavelength of 248 nm or less is particularly low. When the chromium oxynitrocarbide turns into carbon-rich chromium oxynitrocarbide having a high carbon content, the reflectance for exposure light having a wavelength of 248 nm or less decreases, and the reflectance for exposure light having a wavelength of 355 nm or more increases.

Therefore, making the material rich in carbon is advantageous in the case where the multilayer film made of the materials containing chromium is caused to have a reflectance of 22% or less for exposure light having a wavelength of 193 nm, a reflectance of 18% or less for exposure light having a wavelength of 248 nm, and a reflectance of 32% or less for exposure light having a wavelength of 355 nm. In addition, it is advantageous when the reflectance for exposure light having a wavelength of 400 nm is caused to be 27% or more.

From such a viewpoint, it is advantageous that the first layer is made of a material containing chromium, oxygen, nitrogen, and carbon and has the above-described predetermined composition (a chromium content of 43 at % or less, an oxygen content of 32 at % or more, a nitrogen content of 25 at % or less, and a carbon content of 18 at % or less) that is an oxygen-rich composition having a relatively high oxygen content.

Chromium oxynitrocarbide (CrOCN) having a composition in the above range has a reduced reflectance for exposure light having a wavelength of 193 nm or more as the film thickness increases.

On the other hand, chromium oxynitrocarbide (CrOCN) has an increased reflectance for exposure light having a wavelength of 193 nm or more as the film thickness decreases.

From such a viewpoint, it is advantageous to set the thickness to 16 nm or less (as long as the thickness is 8 nm or more).

Chromium oxynitrocarbide (CrOCN) makes the surface roughness Rq of the film better than chromium oxide (CrO). From such a viewpoint, it is advantageous that the first layer has the above-described predetermined composition (a chromium content of 43 at % or less, an oxygen content of 32 at % or more, a nitrogen content of 25 at % or less, and a carbon content of 5 at % or more and 18 at % or less) that is an oxygen- and nitrogen-rich composition having relatively high oxygen, nitrogen, and carbon contents.

As will be described later, the thickness of the first layer is set to 16 nm or less as described above from the viewpoints of the surface roughness Rq, the reflectance, and the resistance value of the multilayer film made of the materials containing chromium.

On the other hand, when the thickness is too thin, there is a possibility that the film is excessively affected by the second layer, and thus the thickness is set to 8 nm or more as described above.

The first layer as described above can be appropriately affected by the second layer (and the third layer) and is useful for obtaining a chromium-containing film in which good surface roughness, proper adjustment of the reflectance, and reduction of the resistance value are achieved.

(Regarding Second Layer)

In the multilayer film made of the materials containing chromium of the present embodiment, the composition of the second layer sandwiched between the first layer and the third layer has a chromium content of 66 at % or more and 92 at % or less, a nitrogen content of 8 at % or more and 30 at % or less, and the thickness is 50 nm or more and 75 nm or less.

The chromium content of the second layer is particularly preferably 70 at % or more and 90 at % or less.

The nitrogen content of the second layer is preferably 30 at % or less and is preferably 8 at, or more, particularly preferably 10 at % or more.

In addition, in the photomask blank inspection apparatus, an increase in the reflectance of the multilayer film made of the materials containing chromium for the exposure light emitted from the light emitting means prevents irradiation with a larger amount of light, so that it is necessary to lower the inspection sensitivity. From this viewpoint, it is desirable that the reflectance for exposure light having a wavelength of 193 nm be 22% or less, particularly 21% or less. It is desirable that the reflectance for exposure light having a wavelength of 248 nm be 18% or less, particularly 17% or less.

It is desirable that the reflectance for exposure light having a wavelength of 355 nm be 32% or less, particularly 30% or less.

In addition, in order to manage the photomask, an exposure apparatus used in a wafer exposure step generally forms a barcode pattern at a mask end of the photomask by photolithography to manage the photomask using information from the barcode. The barcode pattern is read by a device including light emitting means of a wavelength of 400 nm or more and a detector that receives the reflected light.

In the case of receiving reflected light, a reflectance of the multilayer film made of the materials containing chromium of 27% for exposure light having a wavelength of 400 nm or more is required to be secured. From this viewpoint, it is desirable that the reflectance for exposure light having a wavelength of 400 nm be 27% or more.

In addition, in order to satisfy the above-described reflectance (particularly the reflectance for light of 400 nm), the thickness of the second layer is set to 50 nm or more and 75 nm or less, particularly preferably 60 nm or more and 70 nm or less.

When chromium nitride turns into nitrogen-rich chromium nitride having a large nitrogen content, the surface roughness Rq of the film is improved. From such a viewpoint, it is advantageous that the second layer has the above-described predetermined composition (a chromium content of 66 at % or more and 92 at % or less and a nitrogen content of 8 at % or more and 30 at % or less) that is a nitrogen-rich composition having a relatively high nitrogen content. In addition, the surface roughness Rq of the multilayer film made of the materials containing chromium can be set to 0.65 nm or less as long as the contents are in the more preferable ranges described above.

In addition, since the second layer is in contact with the first layer, the first layer having a smaller thickness is more greatly affected by the surface roughness Rq of the second layer. It is therefore advantageous to set the thickness of the first layer to 16 nm or less (as long as the thickness is 8 nm or more) as described above.

When chromium nitride is nitrogen-rich, the reflectance for exposure light having a wavelength of 355 nm is reduced, and the second layer affects the reflectance for exposure light having a wavelength of 355 nm because the second layer is formed in contact with the first layer. From such a viewpoint alone, it is advantageous that the second layer has the above-described predetermined composition that is relatively nitrogen-rich. On the contrary, when chromium nitride contains less nitrogen, the reflectance for exposure light having a wavelength of 400 nm increases, and the second layer affects the reflectance for exposure light having a wavelength of 400 nm because the second layer is formed in contact with the first layer. From such a viewpoint about light having wavelengths of 355 nm and 400 nm, it is advantageous that the second layer has the above-described predetermined composition (a chromium content of 66 at % or more and 92 at % or less and a nitrogen content of 8 at % or more and 30 at % or less).

When the multilayer film made of the materials containing chromium is conveyed into a photomask manufacturing apparatus, the multilayer film is exposed to the atmosphere in the photomask manufacturing apparatus. In the case where the resistance value of the multilayer film made of the materials containing chromium is high, charges are likely to be accumulated on the surface layer of the multilayer film made of the materials containing chromium, and foreign matter having negative charges generated in the photomask manufacturing apparatus is kept away from the film made of the materials containing chromium by Coulomb repulsion. The foreign matter generated in the photomask manufacturing apparatus is therefore hardly adsorbed, and in its use for the purpose of investigating the foreign matter in the photomask manufacturing apparatus, a true apparatus state cannot be investigated. Therefore, as described above, one problem is that the resistance value of the multilayer film made of the materials containing chromium is low.

For the reasons described above, the first layer is made of a material containing chromium, oxygen, and nitrogen and has an oxygen-rich composition with a relatively high oxygen content, but the resistance value of a film of chromium oxide (CrO) is higher than that of chromium nitride (CrN), so that the resistance value of the first layer made of chromium oxynitrocarbide (CrOCN) having an oxygen-rich composition is relatively high.

For the reasons described above, the second layer is made of a material containing chromium and nitrogen and has a nitrogen-rich composition with a relatively high nitrogen content as well as a relatively high chromium content (66 atom % or more and 92 atom % or less), and the sheet resistance value is low. Therefore, it is advantageous that the film thickness of the first layer is reduced as described above and that the second layer has the above-described predetermined composition having a relatively high nitrogen content.

The overall resistance value of the first layer, the second layer, and the third layer of the multilayer film made of the materials containing chromium is preferably, for example, 20Ω/□ or less, particularly preferably 19Ω/□ or less, and due to the above-described characteristics of the first layer and the second layer, the multilayer film made of the materials containing chromium having such a resistance value can be made. In addition, since the second layer is in contact with the first layer, the first layer having a smaller thickness is more greatly affected by the second layer having high conductivity at the time of forming the first layer, and thus the first layer is easily caused to have a composition having low conductivity. From this viewpoint, it is therefore advantageous to set the thickness of the first layer to 16 nm or less (as long as the thickness is 8 nm or more).

(Regarding Third Layer)

In the multilayer film made of the materials containing chromium of the present embodiment, the composition of the third layer, which is the layer on the substrate side, has a chromium content of 44 at % or less, an oxygen content of 30 at % or more, and a nitrogen content of 28 at % or less, and the thickness is 10 nm or less.

The chromium content of the third layer is preferably 43 at % or less and is preferably 30 at % or more, particularly preferably 38 at % or more.

The oxygen content of the third layer is preferably 32 at % or more and is preferably 60 at % or less, particularly preferably 54 at % or less.

The nitrogen content of the third layer is preferably 25 at % or less and is preferably 5 at % or more, particularly preferably 8 at % or more.

The thickness of the third layer is preferably 1 nm or more, particularly preferably 3 nm or more.

In the third layer, contents of oxygen and nitrogen within the above ranges (the oxygen content is 30 at % or more, and the nitrogen content is 26 at % or less) are useful for adjusting the reflectance of the chromium-containing film.

The first layer and the second layer are restricted as described above, and exposure light having a wavelength of 193 nm, a wavelength of 248 nm, a wavelength of 355 nm, and a wavelength of 400 nm passes through the first layer and the second layer and reaches the third layer, so that the configuration of the third layer affects the reflectance of the multilayer film made of the materials containing chromium.

To satisfy requirements that the reflectance for exposure light having a wavelength of 193 nm be 22% or less, the reflectance for exposure light having a wavelength of 248 nm be 18% or less, the reflectance for exposure light having a wavelength of 355 nm be 32% or less, and the reflectance for exposure light having a wavelength of 400 nm be 27% or more, the thickness of the third layer is set to 10 nm or less.

With the photomask blank of the present invention as described above, the surface roughness of the chromium-containing film can be improved. In addition, since the surface roughness is good, it is possible to prevent a large amount of pseudo defects from being detected in defect inspection. Therefore, the inspection capability can be made sufficient without the need to lower the inspection sensitivity for light having a wavelength of 193 nm, a wavelength of 248 nm, and a wavelength of 355 nm, and even small defects having a size of 50 nm or less can be sufficiently detected.

In addition, in particular, since it is possible to set the reflectance for light having a wavelength of 193 nm to 22% or less, the reflectance for light having a wavelength of 248 nm to 18% or less, and the reflectance for light having a wavelength of 355 nm to 32% or less, it is possible to perform highly sensitive defect inspection. At the same time, since the reflectance for light having a wavelength of 400 nm can be set to 27% or more, in the use as a photomask, a bar code pattern for its management can be read.

In addition, the resistance value of the chromium-containing film can be reduced. Therefore, it is possible to adsorb foreign matter in the photomask manufacturing apparatus, which is useful for investigating a true apparatus state.

In particular, when the resistance value of the chromium-containing film is a small resistance value such as 20Ω/□ or less, adsorption of foreign matter can be made more reliable, which is more useful for management of the manufacturing apparatus.

In addition, a photomask pattern can be manufactured by a known photomask process.

In the case where the multilayer film made of the material containing chromium is a light shielding film, particularly in the case where the multilayer film is made to remain as a light shielding film in a portion located at the outer circumferential part, which is a region in which the barcode pattern of the multilayer film made of the materials containing chromium is formed, of the substrate when the multilayer film is used for a photomask and where the detector that reads the barcode receives light emitted from the light emitting means and applied to and reflected by the photomask, the reflectance of the multilayer film made of the materials containing chromium that is the light shielding film can be set to 275 or more, particularly preferably 28% or more, for exposure light, such as light having a wavelength of 400 nm and light having a wavelength of a gallium nitride-based laser, as described above.

The film thickness (total thickness of the first layer, the second layer, and the third layer) of the multilayer film made of the materials containing chromium is preferably 53 nm or more and 100 nm or less. At this time, with such a film thickness, the reflectance of the multilayer film made of the materials containing chromium can be more reliably adjusted to 22% or less for exposure light having a wavelength of 193 nm, 18% or less for exposure light having a wavelength of 248 nm, 32% or less for exposure light having a wavelength of 355 nm, and 27% or more for exposure light having a wavelength of 400 nm. Furthermore, when the film thickness of the multilayer film made of the materials containing chromium is 70 nm or more and 87 nm or less, the reflectance can be more reliably adjusted, which is more preferable.

As illustrated in FIG. 3, in the case where the chromium-containing films (that is, the chromium-containing film 21 on the upper surface side and the back side film 21' on the lower surface side) are provided on both sides of the substrate, the foreign matter can be adsorbed on the lower surface side in addition to the upper surface side, which is more preferable for the management of the photomask manufacturing apparatus.

The photomask blank of the present embodiment may further include a resist film in contact with the side of the multilayer film made of the materials containing chromium spaced apart from the substrate. The resist film may be an electron beam resist drawn with an electron beam, and a photoresist drawn with light is particularly preferable. The photoresist drawn with light may be a negative type, but a positive type is desirable in order to leave a larger area of the multilayer film made of the materials containing chromium.

At the time of fine patterning, in the dry etching step, the resist film disappears by etching simultaneously with the multilayer film made of the materials containing chromium, but it is preferable to increase the film thickness of the resist film so that the resist film will not disappear by etching before the processed part of the multilayer film made of the materials containing chromium disappears by etching. The thickness is preferably 300 nm or more, particularly 400 nm or more.

Figure 5:
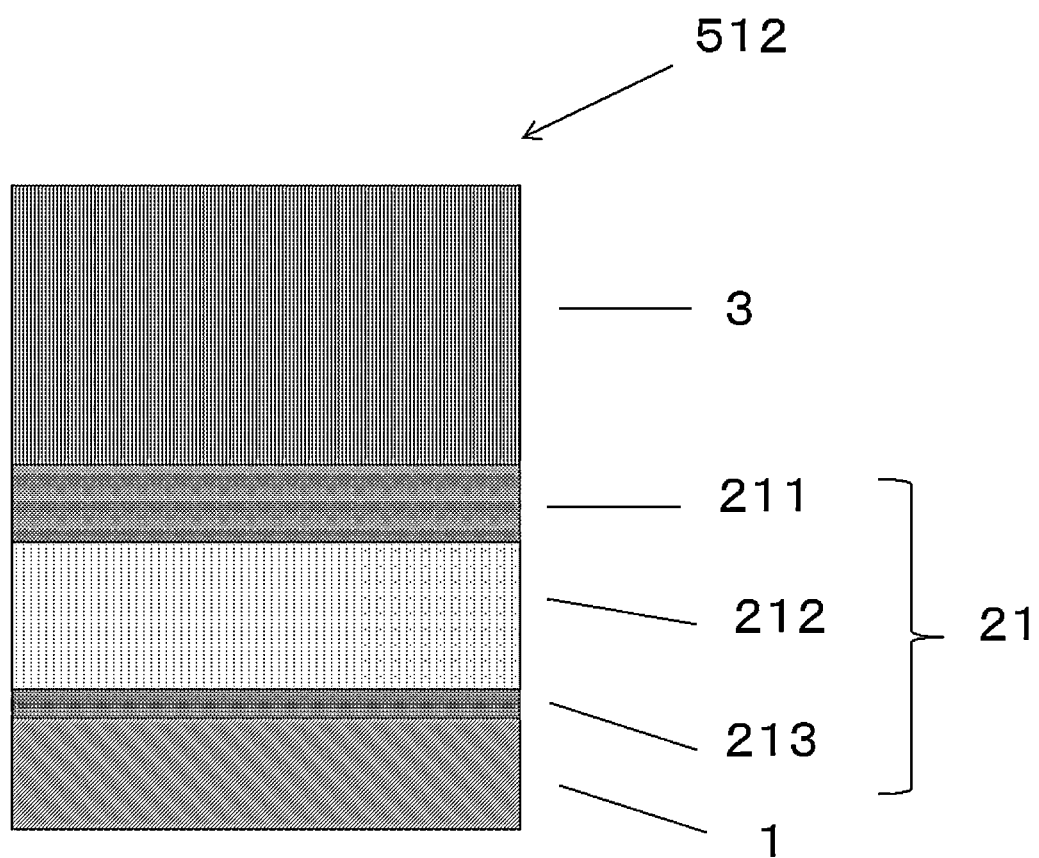
FIG. 5 is a cross-sectional view illustrating another example of the first aspect (photomask blank) of the photomask blank of the present invention.

FIG. 5 is a cross-sectional view illustrating another example of the first aspect of the photomask blank of the present embodiment. This photomask blank 512 includes a resist film 3 formed in contact with the multilayer film (film to be processed) 21 made of the materials containing chromium of the photomask blank illustrated in FIG. 1. The photomask 513 illustrated in FIG. 2 can be manufactured also from the photomask blank 512 illustrated in FIG. 5.

Figure 6:
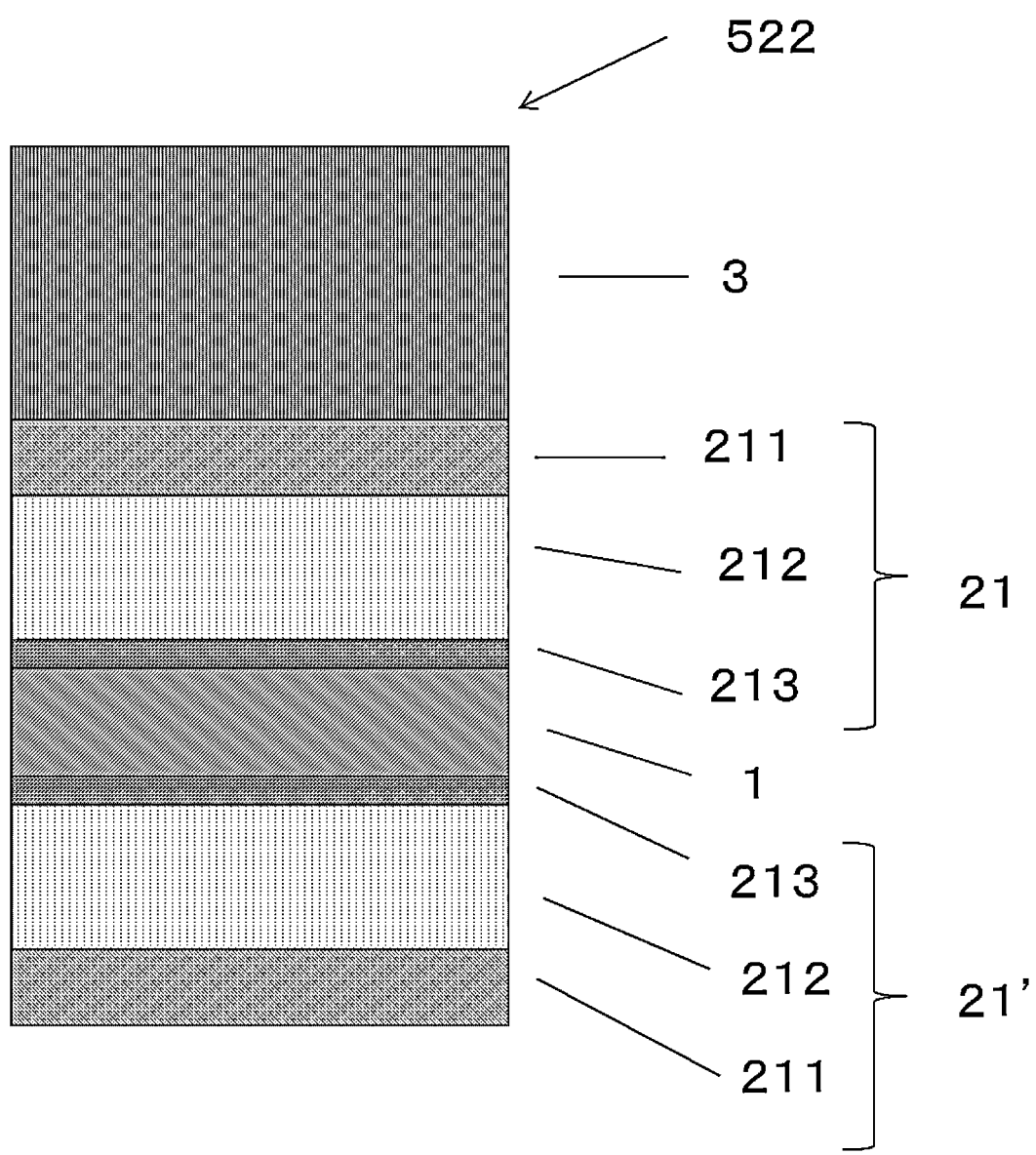
FIG. 6 is a cross-sectional view illustrating another example of the second aspect (photomask blank) of the photomask blank of the present invention.

FIG. 6 is a cross-sectional view illustrating another example of the second aspect of the photomask blank of the present embodiment. This photomask blank 522 includes the resist film 3 formed in contact with the multilayer film (film to be processed) 21 made of the materials containing chromium of the photomask blank illustrated in FIG. 3. The photomask 523 illustrated in FIG. 4 can be manufactured also from the photomask blank 522 illustrated in FIG. 6.

In addition, the photomask of the present invention as illustrated in FIGS. 2 and 4 has the multilayer film made of the materials containing chromium as described above, the composition (chromium, oxygen, nitrogen) thereof is the same as that of the photomask blank of the present invention, and the same effect as that of the photomask blank of the present invention can be obtained. That is, the surface roughness is good, and it is possible to detect a defect having a size of 50 nm, adsorb foreign matter, and read a barcode pattern.

As means for measuring the surface roughness in the present embodiment, an atomic force microscope (AFM) can be exemplified.

Hereinafter, a procedure for manufacturing the photomask blank of the present invention will be described.

The formation of the multilayer film made of the materials containing chromium of the present embodiment on the substrate is not particularly limited, but formation by a sputtering method is preferable because it has good controllability and allows a film having predetermined characteristics to be easily formed. DC sputtering, RF sputtering, and the like can be applied as the sputtering method, and there is no particular limitation.

When a film containing chromium and not containing silicon is formed as the multilayer film made of the materials containing chromium, a chromium target can be used as the sputtering target.

The power supplied to the sputtering target may be appropriately set depending on the size of the sputtering target, cooling efficiency, ease of film formation control, and the like, and usually, the power per area of the sputtering surface of the sputtering target may be 0.1 to 10 W/cm$^2$.

In the case of forming a film of a material including oxygen or nitrogen, the sputtering is preferably reactive sputtering. As the sputtering gas, a rare gas such as a helium gas (He), a neon gas (Ne), and an argon gas (Ar) and a reactive gas are used. For example, when a film of a material including oxygen is formed, oxygen gas ($O_2$ gas) may be used as the reactive gas, and when a film of a material including nitrogen is formed, nitrogen gas ($N_2$ gas) may be used as the reactive gas. When a film of a material including both nitrogen and oxygen is formed, oxygen gas ($O_2$ gas) and nitrogen gas ($N_2$ gas) may be simultaneously used as reactive gases, or nitrogen oxide gas such as nitrogen monoxide gas (NO gas), nitrogen dioxide gas ($NO_2$ gas), or nitrous oxide gas ($N_2O$ gas) may be used as reactive gases. When a material including oxygen, nitrogen, and carbon is formed, oxygen gas ($O_2$ gas), nitrogen gas ($N_2$ gas), and carbon dioxide gas ($CO_2$) may be simultaneously used as reactive gases.

The pressure at the time of film formation may be appropriately set in consideration of film stress, chemical resistance, washing resistance, and the like, and chemical resistance is usually improved by setting the pressure to 0.01 Pa or more, particularly 0.03 Pa or more, and 1 Pa or less, particularly 0.3 Pa or less. Each gas flow rate may be appropriately set so as to provide a desired composition and may be usually 0.1 to 100 sccm.

In the manufacturing process of the photomask blank, the substrate or the substrate and the film formed on the substrate may be subjected to heat treatment. As a method of the heat treatment, infrared heating, resistance heating, and the like can be applied, and conditions of the treatment are not particularly limited. The heat treatment can be performed, for example, in a gas atmosphere including oxygen. The concentration of the gas including oxygen is not particularly limited and can be, for example, 1 to 100 vol % in the case of oxygen gas ($O_2$ gas). The temperature of the heat treatment is preferably 200° C. or higher, particularly 400° C. or higher. In addition, in the manufacturing process of the photomask blank, ozone treatment, plasma treatment, or the like may be performed on the film formed on the substrate, particularly the multilayer film made of the materials containing chromium, and the conditions of the treatment are not particularly limited. Any treatment can be performed for the purpose of increasing the oxygen concentration of the surface part of the film, and in that case, the treatment conditions may be appropriately adjusted so as to achieve a predetermined oxygen concentration. When the film is formed by sputtering, the oxygen concentration of the surface part of the film can be increased by adjusting the ratio of a rare gas to a gas including oxygen (oxidizing gas) such as oxygen gas ($O_2$ gas), carbon monoxide gas (CO gas), and carbon dioxide gas ($CO_2$ gas) in the sputtering gas.

In the manufacturing process of the photomask blank, washing treatment may be performed to remove defects present on the surface of the substrate or the film formed on the substrate. The washing can be performed using one or both of ultrapure water and functional water that is ultrapure water including ozone gas, hydrogen gas, and the like. In addition, after washing with ultrapure water including a surfactant, washing may be further performed using one or both of ultrapure water and functional water. The washing can be performed while applying ultrasonic waves as necessary, and UV light irradiation can also be combined.

When the resist film is formed on the photomask blank of the present embodiment, a method for applying the resist film is not particularly limited, and a known method can be applied.

Next, a manufacturing method of a photomask of the present invention will be described.

The photomask is manufactured from the photomask blank of the present embodiment. FIGS. 7A to 7D are cross-sectional views for illustrating steps for manufacturing a phase shift mask from a phase shift mask blank of a first aspect of the present embodiment.

Figure 7A:
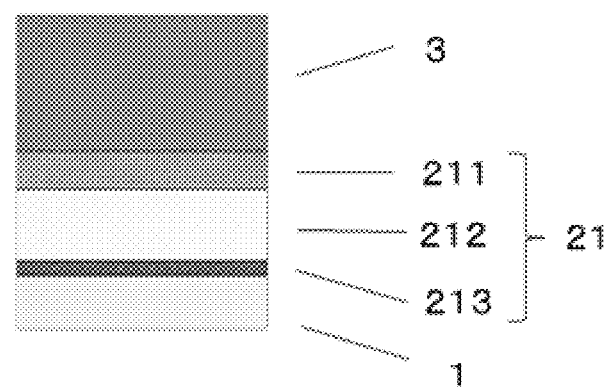
FIGS. 7A to 7D are cross-sectional views for illustrating steps for manufacturing the photomask from the photomask blank of the first aspect of the present invention.

In this case, first, as illustrated in FIG. 7A, the resist film (the film thickness is preferably 300 nm or more, particularly preferably 400 nm or more) 3 is formed in contact with the side of the multilayer film (light shielding film 21) made of the materials containing chromium spaced apart from the transparent substrate 1 (step A).

Figure 7B:
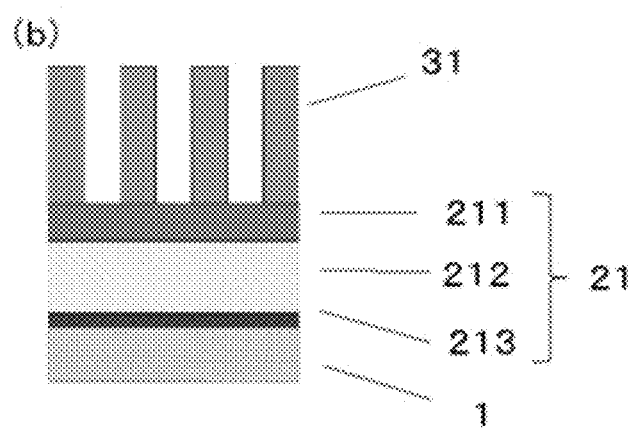

Next, as illustrated in FIG. 7B, the resist film 3 is patterned to form a resist pattern 31 (step B).

Figure 7C:
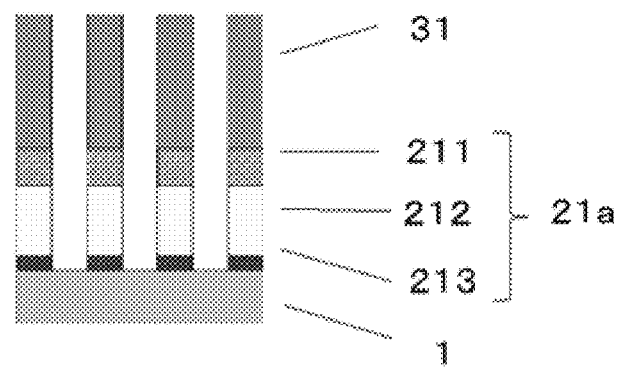

Next, as illustrated in FIG. 7C, the multilayer film (light shielding film 21) including the first layer 211, the second layer 212, and the third layer 213 and made of the materials containing chromium is patterned by chlorine-based dry etching (dry etching using a chlorine-based gas including oxygen) using the resist pattern 31 as an etching mask to form a pattern (light shielding film pattern 21*a*) of the multilayer film made of the materials containing chromium (step C).

Figure 7D:
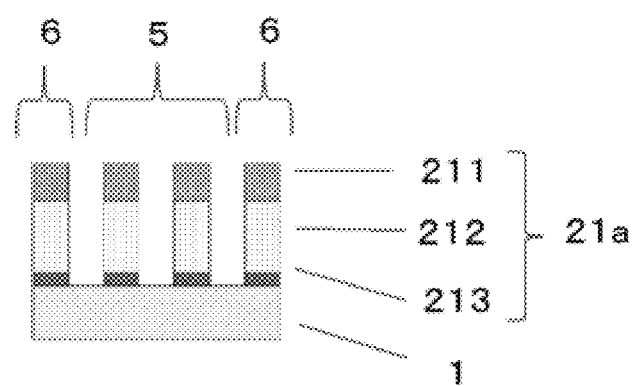

Next, as illustrated in FIG. 7D, the remaining resist pattern 31 is removed, so that a photomask (photo shift mask) can be obtained (step D).

FIGS. 8A to 8D are cross-sectional views for illustrating steps for manufacturing a phase shift mask from a phase shift mask blank of a second aspect of the present embodiment.

Figure 8A:
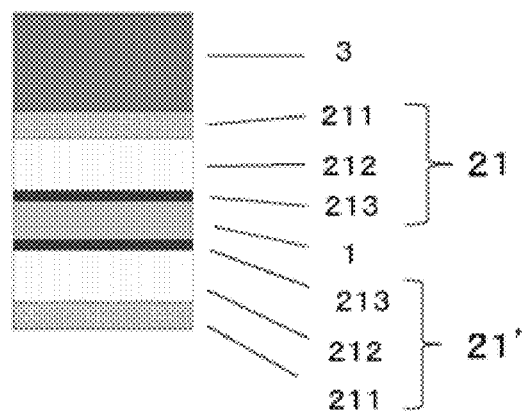
FIGS. 8A to 8D are cross-sectional views for illustrating steps for manufacturing the photomask from the photomask blank of the second aspect of the present invention.

In this case, first, as illustrated in FIG. 8A, the resist film (the film thickness is preferably 300 nm or more, particularly preferably 400 nm or more) 3 is formed in contact with the side of the multilayer film (light shielding film 21) made of the materials containing chromium spaced apart from the transparent substrate 1 on the upper surface side (step A).

Figure 8B:
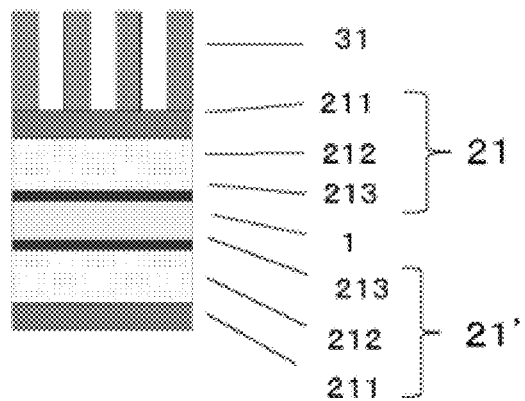

Next, as illustrated in FIG. 8B, the resist film 3 is patterned to form a resist pattern 31 (step B).

Figure 8C:
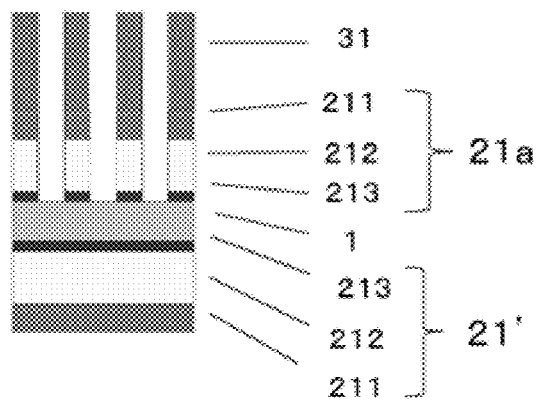

Next, as illustrated in FIG. 8C, the multilayer film (light shielding film 21) including the first layer 211, the second layer 212, and the third layer 213 and made of the materials containing chromium is patterned by chlorine-based dry etching (dry etching using a chlorine-based gas including oxygen) using the resist pattern 31 as an etching mask to form a pattern (light shielding film pattern 21*a*) of the multilayer film made of the materials containing chromium (step C).

Figure 8D:
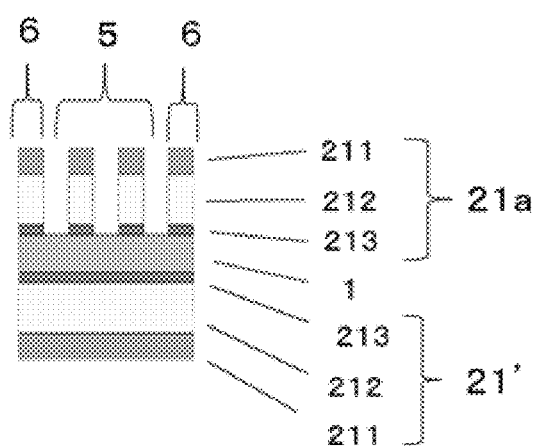

Next, as illustrated in FIG. 8D, the remaining resist pattern 31 is removed, so that a photomask (photo shift mask) can be obtained (step D).

When a photomask is inspected with a photomask pattern appearance inspection apparatus, an alignment mark is required, and the photomask of the present embodiment is particularly effective in exposure to light in which a pattern is transferred to a photoresist film formed on a substrate to be processed as exposure light using an ArF excimer laser (wavelength: 193 nm) or the like, particularly exposure light having a wavelength of 300 nm or more, in photolithography for forming an alignment pattern of 500 nm to 50,000 nm on the substrate to be processed.

In order to manage the photomask, an exposure apparatus used in a wafer exposure step forms a barcode pattern at a mask end of the mask by lithography to perform management.

The photomask of the present embodiment is particularly effective in exposure to light in which a pattern is transferred to a photoresist film formed on a substrate to be processed as exposure light using an ArF excimer laser (wavelength: 193 nm) or the like, particularly exposure light having a wavelength of 300 nm or more, in photolithography for forming a barcode pattern of 100 μm or more on the substrate to be processed.

EXAMPLES

Hereinafter, the present embodiment will be specifically described with reference to Examples and Comparative Examples, but the present embodiment is not limited to the following Examples.

Example 1

A photomask blank was manufactured in which a multilayer film made of materials containing chromium was laminated on a quartz transparent substrate having a size of 152 mm square and a thickness of about 6 mm.

First, a third layer made of CrON was manufactured on the transparent substrate using a chromium target as a target while adjusting the power applied to the target and using argon gas, nitrogen gas, and oxygen gas as sputtering gases. Next, a second layer made of CrN was manufactured using a chromium target as a target while adjusting the power applied to the target and using argon gas and nitrogen gas as sputtering gases. Next, a first layer made of CrOCN was manufactured using a chromium target while adjusting the power applied to the target and using argon gas, nitrogen gas, oxygen gas, and carbon dioxide gas as sputtering gases to provide a photomask blank without a resist film as illustrated in FIG. 1. Table 1 shows the compositions of the first layer, the second layer, and the third layer and the thicknesses of the first layer, the second layer, and the third layer.

The compositions were measured using an X-ray photoelectron spectrometer K-Alpha manufactured by Thermo Fisher Scientific Inc., and the thicknesses of the films (layers) were measured using a stylus profiler P-16+ manufactured by KLA-Tencor Corporation (the same applies hereinafter).

Example 2

A multilayer film made of materials containing chromium was formed on a transparent substrate in the same manner as in Example 1 except that the oxygen content (at %) and the nitrogen content (at %) were reduced and the carbon content (at %) was increased in the first layer as compared with those in Example 1, thereby providing a photomask blank without a resist.

Table 1 shows the compositions of the first layer, the second layer, and the third layer and the thicknesses of the first layer, the second layer, and the third layer.

Example 3

A multilayer film made of materials containing chromium was formed on a transparent substrate in the same manner as in Example 1 except that the oxygen content (at %) and the nitrogen content (at %) were increased and the carbon content (at %) was reduced in the first layer as compared with those in Example 1, thereby providing a photomask blank without a resist.

Table 1 shows the compositions of the first layer, the second layer, and the third layer and the thicknesses of the first layer, the second layer, and the third layer.

Example 4

A multilayer film made of materials containing chromium was formed on a transparent substrate in the same manner as in Example 1 except that the first layer was thicker than in Example 1, thereby providing a photomask blank without a resist film.

Table 1 shows the compositions of the first layer, the second layer, and the third layer and the thicknesses of the first layer, the second layer, and the third layer.

Example 5

A multilayer film made of materials containing chromium was formed on a transparent substrate in the same manner as in Example 1 except that the first layer was thinner than in Example 1, thereby providing a photomask blank without a resist film.

Table 1 shows the compositions of the first layer, the second layer, and the third layer and the thicknesses of the first layer, the second layer, and the third layer.

Comparative Example 1

A first layer with a greater thickness was formed using chromium oxynitride (CrON) instead of chromium oxynitrocarbide (CrOCN) used in Example 1, a second layer with a smaller thickness was formed with a greater chromium content (at %) and a smaller nitrogen content (at %) than in Example 1, and a third layer was formed in the same manner as in Example 1, thereby providing a photomask blank without a resist film.

Table 1 shows the compositions of the first layer, the second layer, and the third layer and the thicknesses of the first layer, the second layer, and the third layer.

Comparative Example 2

A multilayer film made of materials containing chromium was formed on a transparent substrate in the same manner as in Comparative Example 1 except that the chromium content (at %) was reduced and the nitrogen content (at %) was increased in the second layer as compared with those in Comparative Example 1, thereby providing a photomask blank without a resist film.

As compared with Example 1, for the first layer, the chromium content (at %) was increased, the oxygen content (at %) was decreased, the nitrogen content (at %) was increased (as in Comparative Example 1, the carbon content was 0), and the film thickness was increased, and for the second layer, the chromium content (at %) was increased, the nitrogen content (at %) was decreased, and the film thickness was decreased.

Table 1 shows the compositions of the first layer, the second layer, and the third layer and the thicknesses of the first layer, the second layer, and the third layer.

Comparative Example 3

A multilayer film made of materials containing chromium was formed on a transparent substrate in the same manner as in Comparative Example 1 except that the chromium content (at %) was reduced and the nitrogen content (at %) was increased in the second layer as compared with those in Comparative Example 1, thereby providing a photomask blank without a resist film.

As compared with Example 1, for the first layer, the chromium content (at %) was increased, the oxygen content (at %) was decreased, the nitrogen content (at %) was increased (as in Comparative Example 1, the carbon content was 0), and the film thickness was increased, and for the second layer, the chromium content (at %) was increased, the nitrogen content (at %) was decreased, and the film thickness was decreased.

Table 1 shows the compositions of the first layer, the second layer, and the third layer and the thicknesses of the first layer, the second layer, and the third layer.

Comparative Example 4

A multilayer film made of materials containing chromium was formed on a transparent substrate in the same manner as in Comparative Example 1 except that the chromium content (at %) was reduced and the nitrogen content (at %) was increased in the second layer as compared with those in Comparative Example 1, thereby providing a photomask blank without a resist film.

As compared with Example 1, for the first layer, the chromium content (at %) was increased, the oxygen content (at %) was decreased, the nitrogen content (at %) was increased (as in Comparative Example 1, the carbon content was 0), and the film thickness was increased, and for the second layer, the chromium content (at %) was decreased, the nitrogen content (at %) was increased, and the film thickness was decreased.

Table 1 shows the compositions of the first layer, the second layer, and the third layer and the thicknesses of the first layer, the second layer, and the third layer.

Comparative Example 5

A multilayer film made of materials containing chromium was formed on a transparent substrate in the same manner as in Comparative Example 4 except that the first layer was thicker than in Comparative Example 4, thereby providing a photomask blank without a resist film.

As compared with Example 1, for the first layer, the chromium content (at %) was increased, the oxygen content (at %) was decreased, the nitrogen content (at %) was increased (as in Comparative Example 1, the carbon content was 0), and the film thickness was increased, and for the second layer, the chromium content (at %) was decreased, the nitrogen content (at %) was increased, and the film thickness was decreased.

Table 1 shows the compositions of the first layer, the second layer, and the third layer and the thicknesses of the first layer, the second layer, and the third layer.

Comparative Example 6

A multilayer film made of materials containing chromium was formed on a transparent substrate in the same manner as in Example 1 except that the chromium content (at %) was reduced, the oxygen content (at %) was reduced, the nitrogen content (at %) was reduced, and the carbon content (at %) was increased in the first layer as compared with those in Example 1, thereby providing a photomask blank without a resist film.

Table 1 shows the compositions of the first layer, the second layer, and the third layer and the thicknesses of the first layer, the second layer, and the third layer.

Comparative Example 7

A multilayer film made of materials containing chromium was formed on a transparent substrate in the same manner as in Example 1 except that the chromium content (at %) was increased, the oxygen content (at %) was increased, the nitrogen content (at %) was increased, and the carbon content (at %) was reduced in the first layer as compared with those in Example 1, thereby providing a photomask blank without a resist film.

Table 1 shows the compositions of the first layer, the second layer, and the third layer and the thicknesses of the first layer, the second layer, and the third layer.

Comparative Example 8

A multilayer film made of materials containing chromium was formed on a transparent substrate in the same manner as in Example 1 except that the first layer has a thickness greater than in Example 1, thereby providing a photomask blank without a resist film.

Table 1 shows the compositions of the first layer, the second layer, and the third layer and the thicknesses of the first layer, the second layer, and the third layer.

Comparative Example 9

A multilayer film made of materials containing chromium was formed on a transparent substrate in the same manner as in Example 1 except that the first layer has a thickness smaller than in Example 1, thereby providing a photomask blank without a resist film.

Table 1 shows the compositions of the first layer, the second layer, and the third layer and the thicknesses of the first layer, the second layer, and the third layer.

(Regarding Surface Roughness)

Next, in order to evaluate the surface roughness Rq of the multilayer film made of the materials containing chromium, evaluation was performed using the photomask blanks obtained in Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9.

The surface roughness Rq of the multilayer film made of the materials containing chromium was evaluated using NanoScope V/Dimension Icon manufactured by Bruker AXS (the measurement range is a square region of 1×1 μm).

Table 2 shows the results.

As shown in Table 2, it has been confirmed that the surface roughnesses Rq of the photomask blanks of Comparative Example 1, Comparative Example 2, Comparative Example 3, Comparative Example 4, Comparative Example 5, and Comparative Example 8 were higher than 0.65 nm, whereas the surface roughnesses Rq of the photomask blanks of Example 1, Example 2, Example 3, Example 4, and Example 5, which were the photomask blanks of the present embodiment, were 0.65 nm or less.

This is considered to be because in the photomask blanks of Example 1, Example 2, Example 3, Example 4, and Example 5, chromium nitride that was relatively nitrogen-rich and had good surface roughness Rq was formed in the second layer, and chromium oxynitrocarbide that had good surface roughness Rq was formed in the first layer, as compared with Comparative Example 1 and Comparative Example 2. In addition, as compared with Comparative Example 3, Comparative Example 4, and Comparative Example 5, it is considered that this is because chromium oxynitrocarbide having a good surface roughness Rq was formed in the first layer in the photomask blanks of Example 1, Example 2, Example 3, Example 4, and Example 5. In addition, as compared with Comparative Example 8, it is considered that this is because the first layer had a smaller thickness and was affected by the second layer having good surface roughness Rq in the photomask blanks of Example 1, Example 2, Example 3, Example 4, and Example 5.

(Regarding Reflectance)

Next, in order to evaluate the reflectance of the multilayer film made of the materials containing chromium at a wavelength of 193 nm, a wavelength of 248 nm, a wavelength of 355 nm, and a wavelength of 400 nm, evaluation was performed using the photomask blanks obtained in Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9.

The reflectance at a wavelength of 193 nm, a wavelength of 248 nm, a wavelength of 355 nm, and a wavelength of 400 nm was measured using an ultraviolet-visible near-infrared spectrophotometer SolidSpec-3700 manufactured by Shimadzu Corporation.

Table 3 shows the results at a wavelength of 193 nm. Table 4 shows the results at a wavelength of 248 nm. Table 5 shows the results at a wavelength of 355 nm. Table 6 shows the results at a wavelength of 400 nm.

As shown in Table 3, it has been confirmed that the reflectances at a wavelength of 193 nm of the photomask blanks of Comparative Example 1, Comparative Example 2, Comparative Example 3, Comparative Example 4, Comparative Example 5, Comparative Example 7, and Comparative Example 9 were higher than 22%, whereas the reflectances at a wavelength of 193 nm of the photomask blanks of Example 1, Example 2, Example 3, Example 4, and Example 5 were 22% nm or less.

This is considered to be because in the photomask blanks of Example 1, Example 2, Example 3, Example 4, and Example 5, a layer that was relatively carbon-rich and had a low reflectance at a wavelength of 193 nm was formed in the first layer, as compared with Comparative Example 1, Comparative Example 2, Comparative Example 3, Comparative Example 4, Comparative Example 5, and Comparative Example 7.

As compared with Comparative Example 9, it is considered the first layer had a greater thickness, was not therefore excessively affected by the second layer having a relatively high reflectance, and had a small reflectance in the photomask blanks of Example 1, Example 2, Example 3, Example 4, and Example 5. It is considered that the thickness of the first layer of Comparative Example 9 was too small and was excessively affected.

As shown in Table 4, it has been confirmed that the reflectances at a wavelength of 248 nm of the photomask blanks of Comparative Example 1, Comparative Example 2, Comparative Example 3, Comparative Example 4, Comparative Example 7, and Comparative Example 9 were higher than 18%, whereas the reflectances at a wavelength of 248 nm of the photomask blanks of Example 1, Example 2, Example 3, Example 4, and Example 5 were 18% nm or less.

This is considered to be because in the photomask blanks of Example 1, Example 2, Example 3, Example 4, and Example 5, a layer that was relatively carbon-rich and had a low reflectance at a wavelength of 248 nm was formed in the first layer, as compared with Comparative Example 1, Comparative Example 2, Comparative Example 3, Comparative Example 4, and Comparative Example 7.

As compared with Comparative Example 9, it is considered the first layer had a greater thickness, was not therefore excessively affected by the second layer having a relatively high reflectance, and had a small reflectance in the photomask blanks of Example 1, Example 2, Example 3, Example 4, and Example 5. It is considered that the film thickness of the first layer of Comparative Example 9 was too small and was excessively affected.

As shown in Table 5, it has been confirmed that the reflectances at a wavelength of 355 nm of the photomask blanks of Comparative Example 6 and Comparative Example 9 were higher than 32%, whereas the reflectances at a wavelength of 355 nm of the photomask blanks of Example 1, Example 2, Example 3, Example 4, and Example 5 were 32% nm or less.

This is considered to be because in the photomask blanks of Example 1, Example 2, Example 3, Example 4, and Example 5, a layer that had a relatively low carbon content and a low reflectance at a wavelength of 355 nm was formed in the first layer, as compared with Comparative Example 6.

It is considered to be because in the first layer of Comparative Example 6, the carbon content (at %) was too large, resulting in a small reflectance at a wavelength of 248 nm or less and a too large reflectance at a wavelength of 355 nm or more.

As compared with Comparative Example 9, it is considered the first layer had a greater film thickness, was not therefore excessively affected by the second layer having a relatively high reflectance, and had a small reflectance in the photomask blanks of Example 1, Example 2, Example 3, Example 4, and Example 5. It is considered that the film thickness of the first layer of Comparative Example 9 was too small and was excessively affected.

As shown in Table 6, it has been confirmed that the reflectances at a wavelength of 400 nm of the photomask blanks of Comparative Example 7 and Comparative Example 8 were lower than 27%, whereas the reflectances at a wavelength of 400 nm of the photomask blanks of Example 1, Example 2, Example 3, Example 4, and Example 5 were 27% nm or more.

This is considered to be because in the photomask blanks of Example 1, Example 2, Example 3, Example 4, and Example 5, a layer that was relatively carbon-rich and had a high reflectance at a wavelength of 400 nm was formed in the first layer, as compared with Comparative Example 7.

As compared with Comparative Example 8, it is considered the first layer had a smaller film thickness, was therefore affected by the second layer having a relatively high reflectance, and had a high reflectance in the photomask blanks of Example 1, Example 2, Example 3, Example 4, and Example 5. It is considered that the film thickness of the first layer of Comparative Example 8 was too great, and the influence was too small.

(Regarding Resistance Value)

Next, in order to evaluate the resistance value of the multilayer film made of the materials containing chromium, evaluation was performed using the photomask blanks obtained in Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9.

The resistance values of the chromium films were evaluated using a resistivity meter MCP-T 600 manufactured by Mitsubishi Chemical Corporation.

Table 7 shows the results.

As shown in Table 7, it has been confirmed that the resistance value of the film of the photomask blank of Comparative Example 8 was greater than 20Ω/□, whereas the resistance values of the films of the photomask blanks of Example 1, Example 2, Example 3, Example 4, and Example 5 were smaller than 20 Ω/□.

It is considered to be because the first layer of the photomask blanks of Example 1, Example 2, Example 3, Example 4, and Example 5 had a smaller thickness and was affected by the second layer being relatively nitrogen-rich and having a small resistance value of the film, as compared with Comparative Example 8.

(Regarding Detection Limit)

Next, in order to evaluate the detection limit of the multilayer film made of the materials containing chromium, evaluation was performed using the photomask blanks obtained in Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9 using a photomask blank inspection apparatus.

On the photomask blank obtained in each of Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9, 1,000 polystyrene latex (PSL) standard particles having the same size are arranged at regular intervals in a region of 1 cm×1 cm. The region where the PSL standard particles were disposed was inspected with a photomask blank inspection apparatus having an inspection wavelength of 193 nm, an inspection wavelength of 248 nm, and an inspection wavelength of 355 nm. The size of the PSL standard particles was changed from 70 nm to 36 nm by 2 nm and placed on the photomask blank. For the PSL standard particles having different sizes, the number of defects detected by the photomask blank inspection apparatus is evaluated, and when 95 or more of the 1,000 arranged PSL standard particles can be detected, the PSL standard particles are deemed to be detectable. When the number of PSL standard particles to be detected is less than 955 of the number of 1,000 arranged PSL standard particles, the PSL standard particles are deemed to be undetectable, and the size of the PSL standard particles not less than 95% of which is detected is deemed to be the detection limit.

Table 8 shows the results of inspection with a photomask blank inspection apparatus having an inspection wavelength of 193 nm. Table 9 shows the results of inspection with a photomask blank inspection apparatus having an inspection wavelength of 248 nm. Table 10 shows the results of inspection with a photomask blank inspection apparatus having an inspection wavelength of 355 nm.

As shown in Table 8, it has been confirmed that the photomask blanks of Example 1, Example 2, Example 3, Example 4, and Example 5 exhibited smaller detection limits of defects at an inspection wavelength of 193 nm and enabled detection of smaller defects than the photomask blanks of Comparative Example 1, Comparative Example 2, Comparative Example 3, Comparative Example 4, Comparative Example 5, Comparative Example 7, Comparative Example 8, and Comparative Example 9.

This is considered to be because the photomask blanks of Example 1, Example 2, Example 3, Example 4, and Example 5 had smaller surface roughnesses Rq as shown in Table 2 and had smaller reflectances at a wavelength of 193 nm as shown in Table 3 than the photomask blanks of Comparative Example 1, Comparative Example 2, Comparative Example 3, Comparative Example 4, and Comparative Example 5.

In addition, as shown in Table 2, this is considered to be because the surface roughnesses Rq of the photomask blanks of Example 1, Example 2, Example 3, Example 4, and Example 5 were smaller than that of the photomask blank of Comparative Example 8.

In addition, as shown in Table 3, this is considered to be because the reflectances at a wavelength of 193 nm of the photomask blanks of Example 1, Example 2, Example 3, Example 4, and Example 5 were smaller than those of the photomask blanks of Comparative Example 7 and Comparative Example 9.

As shown in Table 9, it has been confirmed that the photomask blanks of Example 1, Example 2, Example 3, Example 4, and Example 5 exhibited smaller detection limits of defects at an inspection wavelength of 248 nm and enabled detection of smaller defects than the photomask blanks of Comparative Example 1, Comparative Example 2, Comparative Example 3, Comparative Example 4, Comparative Example 5, Comparative Example 7, Comparative Example 8, and Comparative Example 9.

This is considered to be because the photomask blanks of Example 1, Example 2, Example 3, Example 4, and Example 5 had smaller surface roughnesses Rq as shown in Table 2 and had smaller reflectances at a wavelength of 248 nm as shown in Table 4 than the photomask blanks of Comparative Example 1, Comparative Example 2, Comparative Example 3, and Comparative Example 4.

In addition, this is considered to be because the surface roughnesses Rq of the photomask blanks of Example 1, Example 2, Example 3, Example 4, and Example 5 were smaller than in Comparative Example 5 and Comparative Example 8.

In addition, this is considered to be because the reflectances at a wavelength of 248 nm of the photomask blanks of Example 1, Example 2, Example 3, Example 4, and Example 5 were smaller than in Comparative Example 7 and Comparative Example 9.

As shown in Table 10, it has been confirmed that the photomask blanks of Example 1, Example 2, Example 3, Example 4, and Example 5 exhibited smaller detection limits of defects at an inspection wavelength of 355 nm and enabled detection of smaller defects than the photomask blank of Comparative Example 6.

As shown in Table 5, this is considered to be because the reflectances at a wavelength of 355 nm of the photomask blanks of Example 1, Example 2, Example 3, Example 4, and Example 5 were smaller than that of the photomask blank of Comparative Example 6. In Comparative Example 9, the reason why the detection limit of defects at a wavelength of 355 nm was small though the reflectance at a wavelength of 355 nm was large is considered to be that the surface roughness Rq was small as shown in Table 2.

(Regarding Adsorption of Foreign Matter)

Next, in order to evaluate the adsorption amount of foreign matter of the photomask blank in a photomask manufacturing apparatus, evaluation was performed using the photomask blanks obtained in Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9.

First, the photomask blanks obtained in Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9 are inspected with a photomask blank inspection apparatus having an inspection wavelength of 193 nm, an inspection wavelength of 248 nm, and an inspection wavelength of 355 nm.

Next, the photomask blanks obtained in Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9 are conveyed from a loader into a treatment chamber of the photomask manufacturing apparatus and are returned to the loader without being treated. This operation is repeated 20 times.

Thereafter, the photomask blanks obtained in Example 1, Example 2, Example 3, Example 4, Example 5, Comparative Example 1, Comparative Example 2, Comparative Example 3, Comparative Example 4, Comparative Example 5, Comparative Example 6, Comparative Example 7, Comparative Example 8, and Comparative Example 9 were inspected again with the photomask blank inspection apparatus having an inspection wavelength of 193 nm, an inspection wavelength of 248 nm, and an inspection wavelength of 355 nm to count the number of increased defects.

Table 11 shows the results of inspection with the photomask blank inspection apparatus having an inspection wavelength of 193 nm. Table 12 shows the results of inspection with the photomask blank inspection apparatus having an inspection wavelength of 248 nm. Table 13 shows the results of inspection with the photomask blank inspection apparatus having an inspection wavelength of 355 nm.

As shown in Table 11, it has been confirmed that the photomask blanks of Example 1, Example 2, Example 3, Example 4, and Example 5 adsorbed more foreign matter than the photomask blanks of Comparative Example 1, Comparative Example 2, Comparative Example 3, Comparative Example 4, Comparative Example 5, Comparative Example 7, Comparative Example 8, and Comparative Example 9. Inspection was performed with the photomask blank inspection apparatus having a wavelength of 193 nm.

This is considered to be because, as shown in Table 8, the photomask blanks of Example 1, Example 2, Example 3, Example 4, and Example 5 had smaller detection limits with the inspection apparatus using a wavelength of 193 nm than those of Comparative Example 1, Comparative Example 2, Comparative Example 3, Comparative Example 4, Comparative Example 5, Comparative Example 7, and Comparative Example 9. In addition, this is considered to be because the photomask blanks of Example 1, Example 2, Example 3, Example 4, and Example 5 exhibited smaller detection limits with the inspection apparatus using a wavelength of 193 nm and had smaller resistance values of the films than in Comparative Example 8.

As shown in Table 12, it has been confirmed that the photomask blanks of Example 1, Example 2, Example 3, Example 4, and Example 5 adsorbed more foreign matter than the photomask blanks of Comparative Example 1, Comparative Example 2, Comparative Example 3, Comparative Example 4, Comparative Example 5, Comparative Example 7, Comparative Example 8, and Comparative Example 9. Inspection was performed with the photomask blank inspection apparatus having a wavelength of 248 nm.

This is considered to be because, as shown in Table 9, the photomask blanks of Example 1, Example 2, Example 3, Example 4, and Example 5 had smaller detection limits with the inspection apparatus using a wavelength of 248 nm than those of Comparative Example 1, Comparative Example 2, Comparative Example 3, Comparative Example 4, Comparative Example 5, Comparative Example 7, and Comparative Example 9. In addition, this is considered to be because the photomask blanks of Example 1, Example 2, Example 3, Example 4, and Example 5 exhibited smaller detection limits with the inspection apparatus using a wavelength of 248 nm and had smaller resistance values of the films than in Comparative Example 8.

As shown in Table 13, it has been confirmed that the photomask blanks of Example 1, Example 2, Example 3, Example 4, and Example 5 adsorbed more foreign matter than the photomask blanks of Comparative Example 2, Comparative Example 3, Comparative Example 5, and Comparative Example 8. Inspection was performed with the photomask blank inspection apparatus having a wavelength of 355 nm.

This is considered to be because, as shown in Table 10, the photomask blanks of Example 1, Example 2, Example 3, Example 4, and Example 5 had smaller detection limits with the inspection apparatus using a wavelength of 355 nm than those of Comparative Example 2 and Comparative Example 3. In addition, this is considered to be because the photomask blanks of Example 1, Example 2, Example 3, Example 4, and Example 5 exhibited smaller detection limits with the inspection apparatus using a wavelength of 355 nm and had smaller resistance values of the film than in Comparative Example 8. In addition, this is considered to be because the resistance values of the films of the photomask blanks of Example 1, Example 2, Example 3, Example 4, and Example 5 were smaller than in Comparative Example 5.

TABLE 1

| | | Content (at %) | | | | Thickness (nm) | Total thickness [nm] |
|---|---|---|---|---|---|---|---|
| | | Chromium | Oxygen | Nitrogen | Carbon | | |
| Example 1 | First layer | 40.1 | 35.4 | 12.1 | 12.4 | 12 | 84 |
| | Second layer | 78.2 | 0.0 | 21.8 | 0.0 | 67 | |
| | Third layer | 41.2 | 34.4 | 24.4 | 0.0 | 5 | |
| Example 2 | First layer | 40.0 | 33.0 | 10.0 | 17.0 | 12 | 84 |
| | Second layer | 78.2 | 0.0 | 21.8 | 0.0 | 67 | |
| | Third layer | 41.2 | 34.4 | 24.4 | 0.0 | 5 | |
| Example 3 | First layer | 40.0 | 36.0 | 14.0 | 10.0 | 12 | 84 |
| | Second layer | 78.2 | 0.0 | 21.8 | 0.0 | 67 | |
| | Third layer | 41.2 | 34.4 | 24.4 | 0.0 | 5 | |
| Example 4 | First layer | 40.1 | 35.4 | 12.1 | 12.4 | 15 | 87 |
| | Second layer | 78.2 | 0.0 | 21.8 | 0.0 | 67 | |
| | Third layer | 41.2 | 34.4 | 24.4 | 0.0 | 5 | |
| Example 5 | First layer | 40.1 | 35.4 | 12.1 | 12.4 | 10 | 82 |
| | Second layer | 78.2 | 0.0 | 21.8 | 0.0 | 67 | |
| | Third layer | 41.2 | 34.4 | 24.4 | 0.0 | 5 | |
| Comparative Example 1 | First layer | 41.2 | 34.4 | 24.4 | 0.0 | 14 | 84 |
| | Second layer | 86.1 | 0.0 | 13.9 | 0.0 | 65 | |
| | Third layer | 41.2 | 34.4 | 24.4 | 0.0 | 5 | |
| Comparative Example 2 | First Layer | 41.2 | 34.4 | 24.4 | 0.0 | 14 | 84 |
| | Second layer | 84.1 | 0.0 | 15.9 | 0.0 | 65 | |
| | Third layer | 41.2 | 34.4 | 24.4 | 0.0 | 5 | |

TABLE 1-continued

|  |  | Content (at %) | | | | Thickness (nm) | Total thickness [nm] |
|---|---|---|---|---|---|---|---|
|  |  | Chromium | Oxygen | Nitrogen | Carbon | | |
| Comparative Example 3 | First layer | 41.2 | 34.4 | 24.4 | 0.0 | 14 | 84 |
|  | Second layer | 80.3 | 0.0 | 19.7 | 0.0 | 65 | |
|  | Third layer | 41.2 | 34.4 | 24.4 | 0.0 | 5 | |
| Comparative Example 4 | First layer | 41.2 | 34.4 | 24.4 | 0.0 | 14 | 84 |
|  | Second layer | 72.6 | 0.0 | 27.4 | 0.0 | 65 | |
|  | Third layer | 41.2 | 34.4 | 24.4 | 0.0 | 5 | |
| Comparative Example 5 | First layer | 41.2 | 34.4 | 24.4 | 0.0 | 18 | 88 |
|  | Second layer | 72.6 | 0.0 | 27.4 | 0.0 | 65 | |
|  | Third layer | 41.2 | 34.4 | 24.4 | 0.0 | 5 | |
| Comparative Example 6 | First layer | 37.0 | 32.0 | 11.0 | 20.0 | 12 | 84 |
|  | Second layer | 78.2 | 0.0 | 21.8 | 0.0 | 67 | |
|  | Third layer | 41.2 | 34.4 | 24.4 | 0.0 | 5 | |
| Comparative Example 7 | First layer | 42.1 | 39.1 | 14.8 | 4.0 | 12 | 84 |
|  | Second layer | 78.2 | 0.0 | 21.8 | 0.0 | 67 | |
|  | Third layer | 41.2 | 34.4 | 24.4 | 0.0 | 5 | |
| Comparative Example 8 | First layer | 40.1 | 35.4 | 12.1 | 12.4 | 18 | 90 |
|  | Second layer | 78.2 | 0.0 | 21.8 | 0.0 | 67 | |
|  | Third layer | 41.2 | 34.4 | 24.4 | 0.0 | 5 | |
| Comparative Example 9 | First layer | 40.1 | 35.4 | 12.1 | 12.4 | 7 | 79 |
|  | Second layer | 78.2 | 0.0 | 21.8 | 0.0 | 67 | |
|  | Third layer | 41.2 | 34.4 | 24.4 | 0.0 | 5 | |

TABLE 2

|  | Surface roughness Rq [nm] | Difference [nm] in surface roughness Rq [nm] from Comparative Example 1 | Difference [nm] in surface roughness Rq [nm] from Comparative Example 2 | Difference [nm] in surface roughness Rq [nm] from Comparative Example 3 | Difference [nm] in surface roughness Rq [nm] from Comparative Example 4 | Difference [nm] in surface roughness Rq [nm] from Comparative Example 8 |
|---|---|---|---|---|---|---|
| Example 1 | 0.60 | −0.70 | −0.60 | −0.50 | −0.20 | −0.20 |
| Example 2 | 0.60 | −0.70 | −0.60 | −0.50 | −0.20 | −0.20 |
| Example 3 | 0.60 | −0.70 | −0.60 | −0.50 | −0.20 | −0.20 |
| Example 4 | 0.62 | −0.68 | −0.58 | −0.48 | −0.18 | −0.18 |
| Example 5 | 0.50 | −0.80 | −0.70 | −0.60 | −0.30 | −0.30 |
| Comparative Example 1 | 1.30 | 0.00 | 0.10 | 0.20 | 0.50 | 0.50 |
| Comparative Example 2 | 1.20 | −0.10 | 0.00 | 0.10 | 0.40 | 0.40 |
| Comparative Example 3 | 1.10 | −0.20 | −0.10 | 0.00 | 0.30 | 0.30 |
| Comparative Example 4 | 0.80 | −0.50 | −0.40 | −0.30 | 0.00 | 0.00 |
| Comparative Example 5 | 0.70 | −0.60 | −0.50 | −0.40 | −0.10 | −0.10 |

TABLE 2-continued

|  | Surface roughness Rq [nm] | Difference [nm] in surface roughness Rq [nm] from Comparative Example 1 | Difference [nm] in surface roughness Rq [nm] from Comparative Example 2 | Difference [nm] in surface roughness Rq [nm] from Comparative Example 3 | Difference [nm] in surface roughness Rq [nm] from Comparative Example 4 | Difference [nm] in surface roughness Rq [nm] from Comparative Example 8 |
|---|---|---|---|---|---|---|
| Comparative Example 6 | 0.60 | −0.70 | −0.60 | −0.50 | −0.20 | −0.20 |
| Comparative Example 7 | 0.60 | −0.70 | −0.60 | −0.50 | −0.20 | −0.20 |
| Comparative Example 8 | 0.80 | −0.50 | −0.40 | −0.30 | 0.00 | 0.00 |
| Comparative Example 9 | 0.45 | −0.85 | −0.75 | −0.65 | −0.35 | −0.35 |

TABLE 3

|  | Reflectance [%] at wavelength of 193 nm | Difference [nm] in reflectance [%] at wavelength of 193 nm from Comparative Example 1 | Difference [nm] in reflectance [%] at wavelength of 193 nm from Comparative Example 2 | Difference [nm] in reflectance [%] at wavelength of 193 nm from Comparative Example 3 | Difference [nm] in reflectance [%] at wavelength of 193 nm from Comparative Example 4 | Difference [nm] in reflectance [%] at wavelength of 193 nm from Comparative Example 5 | Difference [nm] in reflectance [%] at wavelength of 193 nm from Comparative Example 7 | Difference [nm] in reflectance [%] at wavelength of 193 nm from Comparative Example 9 |
|---|---|---|---|---|---|---|---|---|
| Example 1 | 19.5 | −6.5 | −5.6 | −4.6 | −3.9 | −2.8 | −4.5 | −4.5 |
| Example 2 | 18.0 | −8.0 | −7.1 | −6.1 | −5.4 | −4.3 | −6.0 | −6.0 |
| Example 3 | 21.0 | −5.0 | −4.1 | −3.1 | −2.4 | −1.3 | −3.0 | −3.0 |
| Example 4 | 18.6 | −7.4 | −6.5 | −5.5 | −4.8 | −3.7 | −5.4 | −5.4 |
| Example 5 | 21.0 | −5.0 | −4.1 | −3.1 | −2.4 | −1.3 | −3.0 | −3.0 |
| Comparative Example 1 | 26.0 | 0.0 | 0.9 | 1.9 | 2.6 | 3.7 | 2.0 | 2.0 |
| Comparative Example 2 | 25.1 | −0.9 | 0.0 | 1.0 | 1.7 | 2.8 | 1.1 | 1.1 |
| Comparative Example 3 | 24.1 | −1.9 | −1.0 | 0.0 | 0.7 | 1.8 | 0.1 | 0.1 |
| Comparative Example 4 | 23.4 | −2.6 | −1.7 | −0.7 | 0.0 | 1.1 | −0.6 | −0.6 |
| Comparative Example 5 | 22.3 | −3.7 | −2.8 | −1.8 | −1.1 | 0.0 | −1.7 | −1.7 |
| Comparative Example 6 | 17.0 | −9.0 | −8.1 | −7.1 | −6.4 | −5.3 | −7.0 | −7.0 |
| Comparative Example 7 | 24.0 | −2.0 | −1.1 | −0.1 | 0.6 | 1.7 | 0.0 | 0.0 |
| Comparative Example 8 | 17.0 | −9.0 | −8.1 | −7.1 | −6.4 | −5.3 | −7.0 | −7.0 |
| Comparative Example 9 | 24.0 | −2.0 | −1.1 | −0.1 | 0.6 | 1.7 | 0.0 | 0.0 |

TABLE 4

|  | Reflectance [%] at wavelength of 248 nm | Difference [nm] in reflectance [%] at wavelength of 248 nm from Comparative Example 1 | Difference [nm] in reflectance [%] at wavelength of 248 nm from Comparative Example 2 | Difference [nm] in reflectance [%] at wavelength of 248 nm from Comparative Example 3 | Difference [nm] in reflectance [%] at wavelength of 248 nm from Comparative Example 4 | Difference [nm] in reflectance [%] at wavelength of 248 nm from Comparative Example 7 | Difference [nm] in reflectance [%] at wavelength of 248 nm from Comparative Example 9 |
|---|---|---|---|---|---|---|---|
| Example 1 | 15.5 | −5.8 | −4.9 | −4.3 | −3.7 | −4.5 | −4.5 |
| Example 2 | 14.0 | −7.3 | −6.4 | −5.8 | −5.2 | −6.0 | −6.0 |
| Example 3 | 17.0 | −4.3 | −3.4 | −2.8 | −2.2 | −3.0 | −3.0 |
| Example 4 | 15.1 | −6.2 | −5.3 | −4.7 | −4.1 | −4.9 | −4.9 |

TABLE 4-continued

|  | Reflectance [%] at wavelength of 248 nm | Difference [nm] in reflectance [%] at wavelength of 248 nm from Comparative Example 1 | Difference [nm] in reflectance [%] at wavelength of 248 nm from Comparative Example 2 | Difference [nm] in reflectance [%] at wavelength of 248 nm from Comparative Example 3 | Difference [nm] in reflectance [%] at wavelength of 248 nm from Comparative Example 4 | Difference [nm] in reflectance [%] at wavelength of 248 nm from Comparative Example 7 | Difference [nm] in reflectance [%] at wavelength of 248 nm from Comparative Example 9 |
|---|---|---|---|---|---|---|---|
| Example 5 | 17.0 | −4.3 | −3.4 | −2.8 | −2.2 | −3.0 | −3.0 |
| Comparative Example 1 | 21.3 | 0.0 | 0.9 | 1.5 | 2.1 | 1.3 | 1.3 |
| Comparative Example 2 | 20.4 | −0.9 | 0.0 | 0.6 | 1.2 | 0.4 | 0.4 |
| Comparative Example 3 | 19.8 | −1.5 | −0.6 | 0.0 | 0.6 | −0.2 | −0.2 |
| Comparative Example 4 | 19.2 | −2.1 | −1.2 | −0.6 | 0.0 | −0.8 | −0.8 |
| Comparative Example 5 | 17.1 | −4.2 | −3.3 | −2.7 | −2.1 | −2.9 | −2.9 |
| Comparative Example 6 | 13.0 | −8.3 | −7.4 | −6.8 | −6.2 | −7.0 | −7.0 |
| Comparative Example 7 | 20.0 | −1.3 | −0.4 | 0.2 | 0.8 | 0.0 | 0.0 |
| Comparative Example 8 | 13.0 | −8.3 | −7.4 | −6.8 | −6.2 | −7.0 | −7.0 |
| Comparative Example 9 | 20.0 | −1.3 | −0.4 | 0.2 | 0.8 | 0.0 | 0.0 |

TABLE 5

|  | Reflectance [%] at wavelength of 355 nm | Difference [%] in reflectance [%] at wavelength |
|---|---|---|
| Example 1 | 26.0 | −8.0 |
| Example 2 | 29.0 | −5.0 |
| Example 3 | 24.0 | −10.0 |
| Example 4 | 24.7 | −9.3 |
| Example 5 | 29.4 | −4.6 |
| Comparative Example 1 | 28.0 | −6.0 |
| Comparative Example 2 | 27.0 | −7.0 |
| Comparative Example 3 | 26.8 | −7.2 |
| Comparative Example 4 | 26.7 | −7.3 |
| Comparative Example 5 | 24.0 | −10.0 |
| Comparative Example 6 | 34.0 | 0.0 |
| Comparative Example 7 | 24.0 | −10.0 |
| Comparative Example 8 | 24.0 | −10.0 |
| Comparative Example 9 | 32.1 | −1.9 |

TABLE 6

|  | Reflectance [%] at wavelength of 400 nm | Difference [%] in reflectance [%] at wavelength of 400 nm from Comparative Example 7 | Difference [%] in reflectance [%] at wavelength of 400 nm from Comparative Example 8 |
|---|---|---|---|
| Example 1 | 30.0 | 3.3 | 3.2 |
| Example 2 | 34.0 | 7.3 | 7.2 |
| Example 3 | 28.2 | 1.5 | 1.4 |
| Example 4 | 28.7 | 2.0 | 1.9 |
| Example 5 | 34.1 | 7.4 | 7.3 |
| Comparative Example 1 | 33.0 | 6.3 | 6.2 |
| Comparative Example 2 | 32.0 | 5.3 | 5.2 |
| Comparative Example 3 | 31.5 | 4.8 | 4.7 |
| Comparative Example 4 | 31.3 | 4.6 | 4.5 |
| Comparative Example 5 | 31.0 | 4.3 | 4.2 |
| Comparative Example 6 | 36.0 | 9.3 | 9.2 |
| Comparative Example 7 | 26.7 | 0.0 | −0.1 |
| Comparative Example 8 | 26.8 | 0.1 | 0.0 |
| Comparative Example 9 | 35.1 | 8.4 | 8.3 |

TABLE 7

|  | Resistance [Ω/□] of film | Difference [Ω/□] in resistance [Ω/□] of film, from Comparative Example 8 |
|---|---|---|
| Example 1 | 14 | −20 |
| Example 2 | 14 | −20 |
| Example 3 | 14 | −20 |
| Example 4 | 18 | −16 |
| Example 5 | 13 | −21 |
| Comparative Example 1 | 14 | −20 |
| Comparative Example 2 | 15 | −19 |
| Comparative Example 3 | 16 | −18 |
| Comparative Example 4 | 17 | −17 |
| Comparative Example 5 | 19 | −15 |
| Comparative Example 6 | 14 | −20 |
| Comparative Example 7 | 14 | −20 |
| Comparative Example 8 | 34 | 0 |
| Comparative Example 9 | 13 | −21 |

TABLE 8

| | Detection limit [nm] at wevelength of 193 nm | Difference [nm] in detection limit at wavelength of 193 nm from Comparative Example 1 | Difference [nm] in detection limit at wavelength of 193 nm from Comparative Example 2 | Difference [nm] in detection limit at wavelength of 193 nm from Comparative Example 3 | Difference [nm] in detection limit at wavelength of 193 nm from Comparative Example 4 | Difference [nm] in detection limit at wavelength of 193 nm from Comparative Example 5 | Difference [nm] in detection limit at wavelength of 193 nm from Comparative Example 7 | Difference [nm] in detection limit at wavelength of 193 nm from Comparative Example 9 |
|---|---|---|---|---|---|---|---|---|
| Example 1 | 40 | −20 | −18 | −16 | −14 | −12 | −16 | −12 |
| Example 2 | 40 | −20 | −18 | −16 | −14 | −12 | −16 | −12 |
| Example 3 | 40 | −20 | −18 | −16 | −14 | −12 | −16 | −12 |
| Example 4 | 40 | −20 | −18 | −16 | −14 | −12 | −16 | −12 |
| Example 5 | 40 | −20 | −18 | −16 | −14 | −12 | −16 | −12 |
| Comparative Example 1 | 60 | 0 | 2 | 4 | 6 | 8 | 4 | 8 |
| Comparative Example 2 | 58 | −2 | 0 | 2 | 4 | 6 | 2 | 6 |
| Comparative Example 3 | 56 | −4 | −2 | 0 | 2 | 4 | 0 | 4 |
| Comparative Example 4 | 54 | −6 | −4 | −2 | 0 | 2 | −2 | 2 |
| Comparative Example 5 | 52 | −8 | −6 | −4 | −2 | 0 | −4 | 0 |
| Comparative Example 6 | 38 | −22 | −20 | −18 | −16 | −14 | −18 | −14 |
| Comparative Example 7 | 56 | −4 | −2 | 0 | 2 | 4 | 0 | 4 |
| Comparative Example 8 | 50 | −10 | −8 | −6 | −4 | −2 | −6 | −2 |
| Comparative Example 9 | 52 | −8 | −6 | −4 | −2 | 0 | −4 | 0 |

TABLE 9

| | Detection limit [nm] at wavelength of 248 nm | Difference [nm] in detection limit at wavelength of 248 nm from Comparative Example 1 | Difference [nm] in detection limit at wavelength of 248 nm from Comparative Example 2 | Difference [nm] in detection limit at wavelength of 248 nm from Comparative Example 3 | Difference [nm] in detection limit at wavelength of 248 nm from Comparative Example 4 | Difference [nm] in detection limit at wavelength of 248 nm from Comparative Example 5 | Difference [nm] in detection limit at wavelength of 248 nm from Comparative Example 7 | Difference [nm] in detection limit at wavelength of 248 nm from Comparative Example 8 | Difference [nm] in detection limit at wavelength of 248 nm from Comparative Example 9 |
|---|---|---|---|---|---|---|---|---|---|
| Example 1 | 42 | −20 | −18 | −16 | −14 | −10 | −16 | −10 | −12 |
| Example 2 | 42 | −20 | −18 | −16 | −14 | −10 | −16 | −10 | −12 |
| Example 3 | 42 | −20 | −18 | −16 | −14 | −10 | −16 | −10 | −12 |
| Example 4 | 42 | −20 | −18 | −16 | −14 | −10 | −16 | −10 | −12 |
| Example 5 | 42 | −20 | −18 | −16 | −14 | −10 | −16 | −10 | −12 |
| Comparative Example 1 | 62 | 0 | 2 | 4 | 6 | 10 | 4 | 10 | 8 |
| Comparative Example 2 | 60 | −2 | 0 | 2 | 4 | 8 | 2 | 8 | 6 |
| Comparative Example 3 | 58 | −4 | −2 | 0 | 2 | 6 | 0 | 6 | 4 |
| Comparative Example 4 | 56 | −6 | −4 | −2 | 0 | 4 | −2 | 4 | 2 |
| Comparative Example 5 | 52 | −10 | −8 | −6 | −4 | 0 | −6 | 0 | −2 |
| Comparative Example 6 | 40 | −22 | −20 | −18 | −16 | −12 | −18 | −12 | −14 |
| Comparative Example 7 | 58 | −4 | −2 | 0 | 2 | 6 | 0 | 6 | 4 |
| Comparative Example 8 | 52 | −10 | −8 | −6 | −4 | 0 | −6 | 0 | −2 |
| Comparative Example 9 | 54 | −8 | −6 | −4 | −2 | 2 | −4 | 2 | 0 |

TABLE 10

| | Detection limit [nm] at wavelength of 355 nm | Difference [nm] in detection limit at wavelength of 355 nm from Comparative Example 6 |
|---|---|---|
| Example 1 | 44 | −10 |
| Example 2 | 44 | −10 |
| Example 3 | 44 | −10 |
| Example 4 | 42 | −12 |
| Example 5 | 42 | −12 |
| Comparative Example 1 | 50 | −4 |
| Comparative Example 2 | 48 | −6 |
| Comparative Example 3 | 46 | −8 |
| Comparative Example 4 | 44 | −10 |
| Comparative Example 5 | 42 | −12 |
| Comparative Example 6 | 54 | 0 |
| Comparative Example 7 | 40 | −14 |
| Comparative Example 8 | 50 | −4 |
| Comparative Example 9 | 44 | −10 |

TABLE 11

| | Number [pieces] of increased defects | Difference [pieces] in number [pieces] of increased defects from Comparative Example 1 | Difference [pieces] in number [pieces] of increased defects from Comparative Example 2 | Difference [pieces] in number [pieces] of increased defects from Comparative Example 3 | Difference [pieces] in number [pieces] of increased defects from Comparative Example 4 | Difference [pieces] in number [pieces] of increased defects from Comparative Example 5 | Difference [pieces] in number [pieces] of increased defects from Comparative Example 7 | Difference [pieces] in number [pieces] of increased defects from Comparative Example 8 | Difference [pieces] in number [pieces] of increased defects from Comparative Example 9 |
|---|---|---|---|---|---|---|---|---|---|
| Example 1 | 60 | 10 | 12 | 14 | 18 | 18 | 24 | 17 | 18 |
| Example 2 | 60 | 10 | 12 | 14 | 18 | 18 | 24 | 17 | 18 |
| Example 3 | 60 | 10 | 12 | 14 | 18 | 18 | 24 | 17 | 18 |
| Example 4 | 58 | 8 | 10 | 12 | 16 | 16 | 22 | 15 | 16 |
| Example 5 | 62 | 12 | 14 | 16 | 20 | 20 | 26 | 19 | 20 |
| Comparative Example 1 | 50 | 0 | 2 | 4 | 8 | 8 | 14 | 7 | 8 |
| Comparative Example 2 | 48 | −2 | 0 | 2 | 6 | 6 | 12 | 5 | 6 |
| Comparative Example 3 | 46 | −4 | −2 | 0 | 4 | 4 | 10 | 3 | 4 |
| Comparative Example 4 | 42 | −8 | −6 | −4 | 0 | 0 | 6 | −1 | 0 |
| Comparative Example 5 | 42 | −8 | −6 | −4 | 0 | 0 | 6 | −1 | 0 |
| Comparative Example 6 | 62 | 12 | 14 | 16 | 20 | 20 | 26 | 19 | 20 |
| Comparative Example 7 | 36 | −14 | −12 | −10 | −6 | −6 | 0 | −7 | −6 |
| Comparative Example 8 | 43 | −7 | −5 | −3 | 1 | 1 | 7 | 0 | 1 |
| Comparative Example 9 | 42 | −8 | −6 | −4 | 0 | 0 | 6 | −1 | 0 |

TABLE 12

| | Number [pieces] of increased defects | Difference [pieces] in number [pieces] of increased defects from Comparative Example 1 | Difference [pieces] in number [pieces] of increased defects from Comparative Example 2 | Difference [pieces] in number [pieces] of increased defects from Comparative Example 3 | Difference [pieces] in number [pieces] of increased defects from Comparative Example 4 | Difference [pieces] in number [pieces] of increased defects from Comparative Example 5 | Difference [pieces] in number [pieces] of increased defects from Comparative Example 7 | Difference [pieces] in number [pieces] of increased defects from Comparative Example 8 | Difference [pieces] in number [pieces] of increased defects from Comparative Example 9 |
|---|---|---|---|---|---|---|---|---|---|
| Example 1 | 56 | 16 | 16 | 14 | 14 | 8 | 14 | 30 | 6 |
| Example 2 | 56 | 16 | 16 | 14 | 14 | 8 | 14 | 30 | 6 |
| Example 3 | 56 | 16 | 16 | 14 | 14 | 8 | 14 | 30 | 6 |
| Example 4 | 52 | 12 | 12 | 10 | 10 | 4 | 10 | 26 | 2 |
| Example 5 | 56 | 16 | 16 | 14 | 14 | 8 | 14 | 30 | 6 |
| Comparative Example 1 | 40 | 0 | 0 | −2 | −2 | −8 | −2 | 14 | −10 |
| Comparative Example 2 | 40 | 0 | 0 | −2 | −2 | −8 | −2 | 14 | −10 |

TABLE 12-continued

|  | Number [pieces] of increased defects | Difference [pieces] in number [pieces] of increased defects from Comparative Example 1 | Difference [pieces] in number [pieces] of increased defects from Comparative Example 2 | Difference [pieces] in number [pieces] of increased defects from Comparative Example 3 | Difference [pieces] in number [pieces] of increased defects from Comparative Example 4 | Difference [pieces] in number [pieces] of increased defects from Comparative Example 5 | Difference [pieces] in number [pieces] of increased defects from Comparative Example 7 | Difference [pieces] in number [pieces] of increased defects from Comparative Example 8 | Difference [pieces] in number [pieces] of increased defects from Comparative Example 9 |
|---|---|---|---|---|---|---|---|---|---|
| Comparative Example 3 | 42 | 2 | 2 | 0 | 0 | −6 | 0 | 16 | −8 |
| Comparative Example 4 | 42 | 2 | 2 | 0 | 0 | −6 | 0 | 16 | −8 |
| Comparative Example 5 | 48 | 8 | 8 | 6 | 6 | 0 | 6 | 22 | −2 |
| Comparative Example 6 | 58 | 18 | 18 | 16 | 16 | 10 | 16 | 32 | 8 |
| Comparative Example 7 | 42 | 2 | 2 | 0 | 0 | −6 | 0 | 16 | −8 |
| Comparative Example 8 | 26 | −14 | −14 | −16 | −16 | −22 | −16 | 0 | −24 |
| Comparative Example 9 | 50 | 10 | 10 | 8 | 8 | 2 | 8 | 24 | 0 |

TABLE 13

|  | Number [pieces] of increased defects | Difference [pieces] in number [pieces] of increased defects from Comparative Example 2 | Difference [pieces] in number [pieces] of increased defects from Comparative Example 3 | Difference [pieces] in number [pieces] of increased defects from Comparative Example 5 | Difference [pieces] in number [pieces] of increased defects from Comparative Example 8 |
|---|---|---|---|---|---|
| Example 1 | 50 | 3 | 6 | 16 | 29 |
| Example 2 | 50 | 3 | 6 | 16 | 29 |
| Example 3 | 50 | 3 | 6 | 16 | 29 |
| Example 4 | 55 | 3 | 6 | 16 | 22 |
| Example 5 | 54 | 7 | 10 | 20 | 33 |
| Comparative Example 1 | 50 | 3 | 6 | 16 | 29 |
| Comparative Example 2 | 47 | 0 | 3 | 13 | 26 |
| Comparative Example 3 | 44 | −3 | 0 | 10 | 23 |
| Comparative Example 4 | 52 | 5 | 8 | 18 | 31 |
| Comparative Example 5 | 34 | −13 | −10 | 0 | 13 |
| Comparative Example 6 | 50 | 3 | 6 | 16 | 29 |
| Comparative Example 7 | 50 | 3 | 6 | 16 | 29 |
| Comparative Example 8 | 21 | −26 | −23 | −13 | 0 |
| Comparative Example 9 | 50 | 3 | 6 | 16 | 29 |

The description of the embodiments and the disclosure of the drawings described above are merely examples for describing the invention described in the claims, and the invention described in the claims is not limited by the description of the embodiments or the disclosure of the drawings described above. In addition, the description of the claims as originally filed is merely an example, and the description of the claims can be appropriately changed based on the description of the specification, the drawings, and the like.

REFERENCE SIGNS LIST 1 substrate (transparent substrate)
21 multilayer film (light shielding film) made of materials containing chromium
21' back side film
21a pattern (light shielding film pattern) of multilayer film made of materials containing chromium
211 first layer
212 second layer
213 third layer
3 resist film
31 resist pattern
5 effective region
511, 512, 521, 522 photomask blank
513, 523 photomask
6 light shielding film region

The invention claimed is:

1. A photomask blank comprising:
a substrate; and
a multilayer film being a light shielding film,
wherein the multilayer film includes a first layer, a second layer and a third layer in order, and all of the first layer, the second layer and the third layer are the light shielding film, where the third layer is in contact with the substrate,
wherein the first layer consists of chromium, oxygen, nitrogen and carbon and a chromium content is 43 at % or less, an oxygen content is 32 at % or more, a nitrogen content is 25 at % or less, and a carbon content is 8 at % or more and 18 at % or less, and the first layer has a thickness of 8 nm or more and 16 nm or less,
wherein the second layer consists of chromium and nitrogen and a chromium content is 70 at % or more and 92 at % or less and a nitrogen content is 8 at % or more and 30 at % or less, and the second layer has a thickness of 50 nm or more and 75 nm or less, and
wherein the third layer consists of chromium, oxygen and nitrogen and a chromium content is 44 at % or less, an oxygen content is 30 at % or more, and a nitrogen content is 28 at % or less, and the third layer has a thickness of 10 nm or less, and
wherein a surface roughness Rq of the multilayer film is 0.65 nm or less, wherein a reflectance for exposure light having a wavelength of 193 nm is 22% or less, wherein a reflectance for exposure light having a wavelength of 248 nm is 18% or less, wherein a reflectance for exposure light having a wavelength of 355 nm is 32% or less, wherein a reflectance for exposure light having a wavelength of 400 nm is 27% or more, and wherein the photomask blank is an EUV photomask blank including a multilayer reflective film and an absorber layer, and the multilayer film is a barcode region layer of the EUV photomask blank.

2. The photomask blank according to claim 1, wherein a film thickness of the multilayer film is 53 nm or more and 100 nm or less.

3. The photomask blank according to claim 1, wherein a resistance value of the multilayer film is 20 Q/a or less.

4. The photomask blank according to claim 1, wherein the multilayer film is provided on a front surface side and a back surface side of the substrate.

5. The photomask blank according to claim 1, wherein a film thickness of the multilayer film is 53 nm or more and 100 nm or less, and wherein a resistance value of the multilayer film is 20Ω/□ or less.

6. The photomask blank according to claim 4, wherein a film thickness of the multilayer film is 53 nm or more and 100 nm or less, and wherein a resistance value of the multilayer film is 20Ω/□ or less.

7. A method for manufacturing a photomask having a circuit pattern from the photomask blank according to claim 1, the method comprising:
 (A) a step of forming a resist film on a side of the multilayer film spaced apart from the substrate;
 (B) a step of patterning the resist film to form a resist pattern;
 (C) a step of patterning the multilayer film by dry etching with a chlorine-based gas including oxygen to form a pattern of the multilayer film, wherein the resist pattern is used as an etching mask; and
 (D) a step of removing the resist pattern.

8. A photomask comprising:

a substrate; and a multilayer film being a light shielding film and provided on the substrate, and having an effective region being a circuit pattern, wherein the multilayer film includes a first layer, a second layer and a third layer in order, and all of the first layer, the second layer and the third layer are the light shielding film, where the third layer is in contact with the substrate, wherein the first layer consists of chromium, oxygen, nitrogen and carbon and the chromium content is 43 at % or less, the oxygen content is 32 at % or more, the nitrogen content is 25 at % or less, and the carbon content is 8 at % or more and 18 at % or less, and the first layer has a thickness of 8 nm or more and 16 nm or less, wherein the second layer consists of chromium and nitrogen and the chromium content is 70 at % or more and 92 at % or less and the nitrogen content is 8 at % or more and 30 at % or less, and the second layer has a thickness of 50 nm or more and 75 nm or less, and wherein the third layer consists of chromium, oxygen and nitrogen and the chromium content is 44 at % or less, the oxygen content is 30 at % or more, and the nitrogen content is 28 at % or less, and the third layer has a thickness of 10 nm or less, wherein a surface roughness Rq of the multilayer film is 0.65 nm or less, wherein a reflectance for exposure light having a wavelength of 193 nm is 22% or less, wherein a reflectance for exposure light having a wavelength of 248 nm is 18% or less, wherein a reflectance for exposure light having a wavelength of 355 nm is 32% or less, wherein a reflectance for exposure light having a wavelength of 400 nm is 27% or more, and wherein the photomask blank is an EUV photomask is an EUV photomask including a multilayer reflective film and an absorber layer, and the multilayer film is a barcode region layer of the EUV photomask.

* * * * *